(12) United States Patent
Chung et al.

(10) Patent No.: US 8,372,715 B2
(45) Date of Patent: Feb. 12, 2013

(54) VERTICAL CHANNEL TRANSISTORS AND METHODS FOR FABRICATING VERTICAL CHANNEL TRANSISTORS

(75) Inventors: Hyun-Woo Chung, Seoul (KR); Hui-Jung Kim, Seongnam-si (KR); Yongchul Oh, Suwon-si (KR); Hyun-Gi Kim, Hwaseong-si (KR); Kang-Uk Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/035,145

(22) Filed: Feb. 25, 2011

(65) Prior Publication Data
US 2011/0223731 A1    Sep. 15, 2011

(30) Foreign Application Priority Data
Mar. 11, 2010   (KR) .................. 10-2010-0021902

(51) Int. Cl.
*H01L 21/336* (2006.01)
(52) U.S. Cl. ........................................... 438/270
(58) Field of Classification Search .................. None
See application file for complete search history.

(56) References Cited

U.S. PATENT DOCUMENTS

| | | | |
|---|---|---|---|
| 6,747,306 B1 * | 6/2004 | Dyer | 257/302 |
| 7,964,914 B2 * | 6/2011 | Jung | 257/331 |
| 2009/0072291 A1 | 3/2009 | Takaishi | |
| 2009/0114981 A1 | 5/2009 | Sung et al. | |
| 2009/0159965 A1 | 6/2009 | Jung | |
| 2009/0256194 A1 * | 10/2009 | Kim et al. | 257/330 |

FOREIGN PATENT DOCUMENTS

| | | | |
|---|---|---|---|
| JP | 2009071247 A | 4/2009 | |
| JP | 2009152588 A | 7/2009 | |
| KR | 20090045687 A | 5/2009 | |
| KR | 20090067421 A | 6/2009 | |

* cited by examiner

*Primary Examiner* — Scott B Geyer
(74) *Attorney, Agent, or Firm* — Harness, Dickey & Pierce, P.L.C.

(57) ABSTRACT

Provided are a vertical channel transistor and a method for fabricating a vertical channel transistor. The method includes forming an active layer on a substrate, forming a plurality of vertical channels on the active layer, forming a plurality of isolated gate electrodes to surround sidewalls of the plurality of vertical channels, forming a buried bitline to extend along the active layer between the plurality of vertical channels, forming a plug-in between the plurality of vertical channels to connect the plurality of isolated gate electrodes and forming a wordline on a location where the plug-in and the plurality of isolated gate electrodes are connected.

17 Claims, 45 Drawing Sheets

VERTICAL CHANNEL TRANSISTORS AND METHODS FOR FABRICATING VERTICAL CHANNEL TRANSISTORS

CROSS-REFERENCE TO RELATED APPLICATIONS

This U.S. non-provisional patent application claims priority under 35 U.S.C. §119 to Korean Patent Application No. 10-2010-0021902, filed on Mar. 11, 2010, in the Korean Intellectual Property Office (KIPO), the entire contents of which are herein incorporated by reference.

BACKGROUND

1. Technical Field

Example embodiments relate to semiconductors and, more particularly, to vertical channel transistors and methods for fabricating the same.

2. Description of Related Art

In semiconductor industries, transistors and/or bitlines have been formed by various fabrication techniques. One of these fabrication techniques is to form a metal oxide semiconductor field effect transistor (MOSFET) having a vertical channel. With the decrease in design rule for semiconductor devices, fabrication techniques have advanced to higher integration, higher speed, and higher yield of semiconductor devices. Transistors having a vertical channel have been proposed to improve integration density, resistance, and current driving capability of conventional transistors having a vertical channel.

SUMMARY

Example embodiments of the inventive concepts provide a method for fabricating a vertical channel transistor. A method for fabricating a vertical channel transistor may include forming an active layer on a substrate; forming a plurality of vertical channels on the active layer; forming a plurality of isolated gate electrodes to surround sidewalls of the plurality of vertical channels; forming a buried bitline to extend along the active layer between the plurality of vertical channels; forming a plug-in between the plurality of vertical channels to connect the plurality of isolated gate electrodes; and forming a wordline on a location where the plug-in and the plurality of isolated gate electrodes are connected.

The forming the active layer may include forming the active layer in a line-shape and extending on the substrate in one direction. The forming the plurality of vertical channels may include patterning the active layer such that the plurality of vertical channels are linearly arranged in the one direction, and wherein the vertical channels may be linearly arranged along at least one of the center and edge of the active layer or are arranged in a zigzag pattern along both edges of the active layer.

The forming the active layer may include patterning the substrate to form the active layer to extend on the substrate where two oblique lines cross to have a honeycomb shape. The forming the plurality of vertical channels may include patterning the active layer such that the plurality of vertical channels are arranged in a zigzag pattern on the substrate in one direction, and wherein the plurality of vertical channels may be formed on an intersection of the two oblique lines.

The forming the plurality of isolated gate electrodes may include forming a conductive material between the plurality of vertical channels to expose an upper portion of the plurality of vertical channels, forming a gate spacer on the upper portion of the plurality of vertical channels and patterning the conductive material through an etch using the gate spacer as a mask such that the plurality of isolated gate electrodes are formed in a self-aligned manner to surround sidewalls of the plurality of vertical channels.

The forming the buried bitline may include recessing the active layer between the plurality of vertical channels to form a buried bitline pattern and performing at least one of implanting impurities into the active layer exposed by the buried bitline pattern and filling the buried bitline pattern with a conductive material. The forming the wordline may include forming a wordline contact pattern to extend in a direction intersecting an extending direction of the buried bitline and between two adjacent vertical channels of the plurality of vertical channels to expose the plurality of isolated gate electrodes formed on the sidewalls of the two adjacent vertical channels of the plurality of vertical channels and filling the wordline contact pattern with a conductive material to form the plug-in connecting the plurality of isolated gate electrodes.

The method may further include forming a gate dielectric layer to surround sidewalls of the plurality of vertical channels and forming upper and lower junction areas at upper and lower portions of the plurality of vertical channels.

Example embodiments of the inventive concepts provide a method for fabricating a vertical channel transistor. A method for fabricating a vertical channel transistor may include patterning a substrate to form an active layer, patterning the active layer to form a plurality of vertical channels protruding perpendicularly from the substrate, forming a conductive material between the plurality of vertical channels to expose an upper portion of the plurality of vertical channels, forming a gate spacer on the upper portion of the plurality of vertical channels, forming a plurality of gate electrodes in a self-aligned manner by patterning the conductive material using the gate spacer, the plurality of gate electrodes surrounding sidewalls of the plurality of vertical channels, forming a buried bitline in the active region below the plurality of vertical channels, the buried bitline extending in a first horizontal direction on the substrate and forming a plurality of plug-ins to connect the plurality of gate electrodes, the plurality of plug-ins extending between the plurality of vertical channels in a second horizontal direction perpendicular to the first horizontal direction.

The forming the conductive material may include depositing a gate conductive layer between the plurality of vertical channel and etching the gate conductive layer to form a recessed gate conductive layer exposing the upper portion of the plurality of vertical channels. The forming the gate spacer may include depositing an insulator on the recessed gate conductive layer and patterning the insulator surrounding an outer circumferential surface of the plurality of vertical channels.

The forming the plurality of gate electrodes may include removing a portion of the recessed gate conductive layer through a dry etch using the gate spacer to form a gate isolation pattern, and wherein the plurality of gate electrodes are isolated by the gate isolation pattern at the respective vertical channels of the plurality of vertical channels.

The method may further include implanting impurities into the active layer below the gate isolation pattern to form a lower junction area. The forming the buried bitline may include recessing the active layer below the gate isolation pattern to form a buried bitline pattern overlapped or offset with the plurality of vertical channels and performing at least one of implanting impurities into the active layer exposed by the buried bitline pattern and filling the buried bitline pattern with the conductive material.

The forming the plurality of plug-ins may include forming an insulating layer in the gate isolation pattern to cover the buried bitline, recessing the insulating layer to form a plurality of wordline contact patterns extending in the second horizontal direction between the plurality of vertical channels to expose the plurality of gate electrodes and burying the wordline contact patterns through deposition of the conductive material.

Example embodiments of the inventive concepts provide a vertical channel transistor. A vertical channel transistor may include an active layer protruding from a substrate, a plurality of vertical channels extending perpendicularly from the active layer and arranged in a zigzag pattern on the active layer, a wordline including a plurality of isolated gate electrodes surrounding sidewalls of the vertical channels and a bar-shaped plug-in connecting the plurality of gate electrodes between the plurality of vertical channels and extending in a first horizontal direction on the substrate and a buried bitline extending along an active layer between the vertical channels and extending in a second horizontal direction perpendicular to the first horizontal direction.

The active layer may have at least one of the shape of a line extending in the first horizontal direction on the substrate and the shape of a honeycomb where two oblique lines cross to extend on the substrate. The plurality of vertical channels may be arranged in the first horizontal direction to form a column or arranged in a zigzag pattern at an intersection of the two oblique lines on the honeycomb-shaped active layer. The buried bitline may have the shape of at least one of a line sharing an upper portion of the honeycomb-shaped active layer and the shape of a honeycomb constituting an upper portion of the honeycomb-shaped active layer.

BRIEF DESCRIPTION OF THE DRAWINGS

The inventive concepts will become more apparent in view of the attached drawings and accompanying detailed description. Example embodiments depicted therein are provided by way of example, not by way of limitation, wherein like reference numerals refer to the same or similar elements. The drawings are not necessarily to scale, emphasis instead being placed upon illustrating example embodiments of the inventive concepts.

FIGS. 8A to 17A are top plan views illustrating a method for fabricating a vertical channel transistor according to example embodiments of the inventive concepts, and FIGS. 8B to 17B are cross-sectional views taken along the line I-I' in FIGS. 8A to 17A, respectively.

FIGS. 20A to 24A are top plan views illustrating a method for fabricating a vertical channel transistor according to example embodiments of the inventive concepts, and FIGS. 20B to 24B are cross-sectional views taken along the line II-II' in FIGS. 20A to 24A, respectively.

FIGS. 25A to 27A are top plan views illustrating a method for fabricating a vertical channel transistor according to example embodiments of the inventive concepts, and FIGS. 25B to 27B are cross-sectional views taken along the line III-III' in FIGS. 25A to 27A, respectively.

FIGS. 28A to 30A are top plan views illustrating a method for fabricating a vertical channel transistor according to example embodiments of the inventive concepts, and FIGS. 28B to 30B are cross-sectional views taken along the line IV-IV' in FIGS. 28A to 30A, respectively.

FIGS. 31A to 36A are top plan views illustrating a method for fabricating a vertical channel transistor according to example embodiments of the inventive concepts, and FIGS. 31B to 36B are cross-sectional views taken along the line V-V' in FIGS. 31A to 36A, respectively.

FIGS. 37A to 40A are top plan views illustrating a method for fabricating a vertical channel transistor according to example embodiments of the inventive concepts, and FIGS. 37B to 40B are cross-sectional views taken along the line VI-VI' in FIGS. 37A to 40A, respectively.

DETAILED DESCRIPTION OF EXAMPLE EMBODIMENTS

Figure 1:
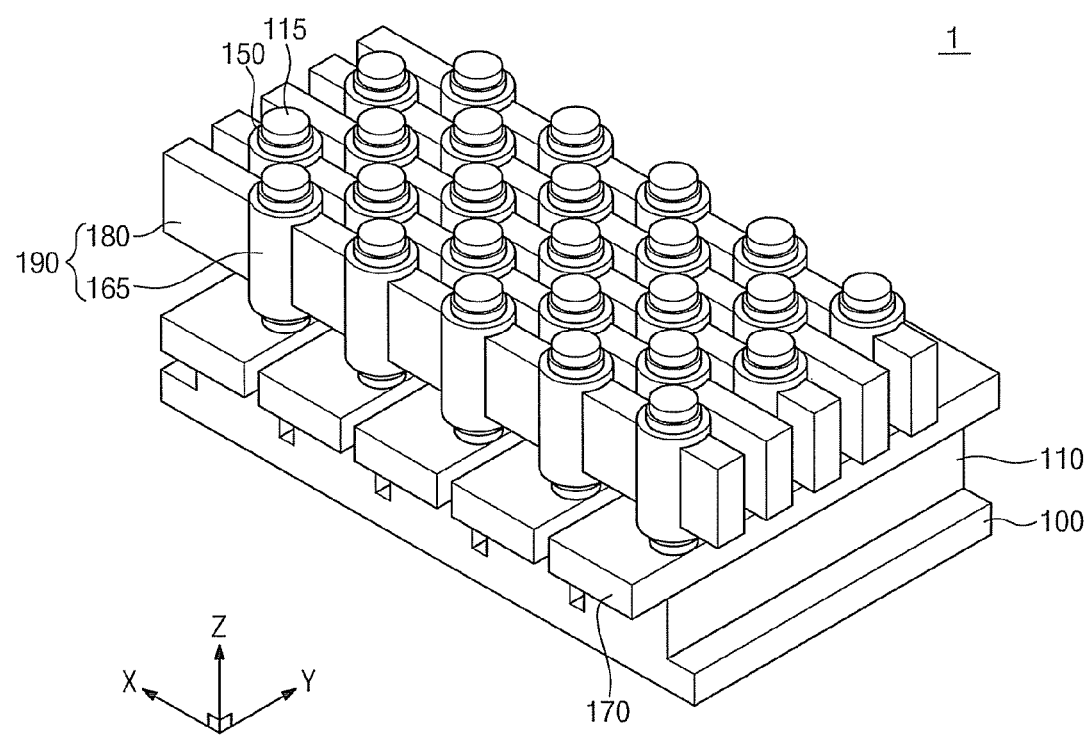
FIG. 1 is a perspective view of a vertical channel transistor according to example embodiments of the inventive concepts.

The inventive concepts will now be described more fully hereinafter with reference to the accompanying drawings, in which example embodiments of the inventive concepts are shown. However, the inventive concepts may be embodied in many different forms and should not be construed as limited to example embodiments set forth herein. Rather, these example embodiments are provided so that this disclosure will be thorough and complete, and will fully convey the scope of the inventive concepts to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a vertical channel transistor 1 according to example embodiments of the inventive concepts. As illustrated, the vertical channel transistor 1 may include a plurality of active layers 110 formed on a semiconductor substrate 100, a plurality of vertical channels 115 protruding from the active layer 110, a plurality of wordlines 190 including a plurality of wordline plug-ins 180 connecting a plurality of gate electrodes 165 disposed on sidewalls of the vertical channels 115, and a plurality of buried bitlines 170 extending in a direction that is substantially perpendicular to the wordlines 190. The vertical channel transistor 1 may further include a gate dielectric layer 150 between the vertical channels 115 and the gate electrode 165, and upper and lower junction areas (not shown) above and below the vertical channels 115. The gate dielectric layer 150 may surround the vertical channels 115.

The active layers 110 may extend in an X direction. A plurality of vertical channels 115 may be arranged in a zigzag pattern on one active layer 110 mainly extending in a Y direction. The vertical channels 115 may protrude from the edge of the active layer 110 in a Z direction. For example, the X, Y, and Z directions may intersect at right angles. The buried bitline 170 may be formed by doping impurities into an active layer 110 adjacent to the bottom edge of the vertical channels 115 or silicidation reaction. Accordingly, the buried bitline 170 may have a similar shape to the active layer 110, e.g., a shape extending in the Y direction. The buried bitline 170 may overlap the vertical channels 115 arranged in the Y direction.

In example embodiments, the vertical channels 115 may protrude in the Z direction that is perpendicular to a surface of the substrate 100. Thus, an extended channel length may be secured to prevent or reduce a short channel effect. Because the gate electrode 165 may be shaped to surround the vertical channels 115 along an outer circumferential surface of the vertical channels 115, current driving capability may be improved. Because the gate electrode 165 may be formed to have a desired width (length in the Z direction), reproducibility of channel length may be secured. The vertical channels 115 may be arranged in a zigzag pattern to increase integration density such that a bridge between the gate electrodes 165 and/or wordlines 190 may be prevented or reduced. Because the gate electrode 165 may be formed in a self-aligned manner, a photolithography process may be omitted. The above characteristics will be understood with reference to methods for fabricating a vertical channel transistor 1 according to example embodiments which will be described later with reference to FIGS. 8A/B through 17A/B. However, a method for fabricating the vertical channel transistor 1 according to example embodiments of the inventive concepts is not limited to the above methods described later with reference to FIGS. 8A/B through 17A/B and various changes and modifications may be made.

Figure 2:
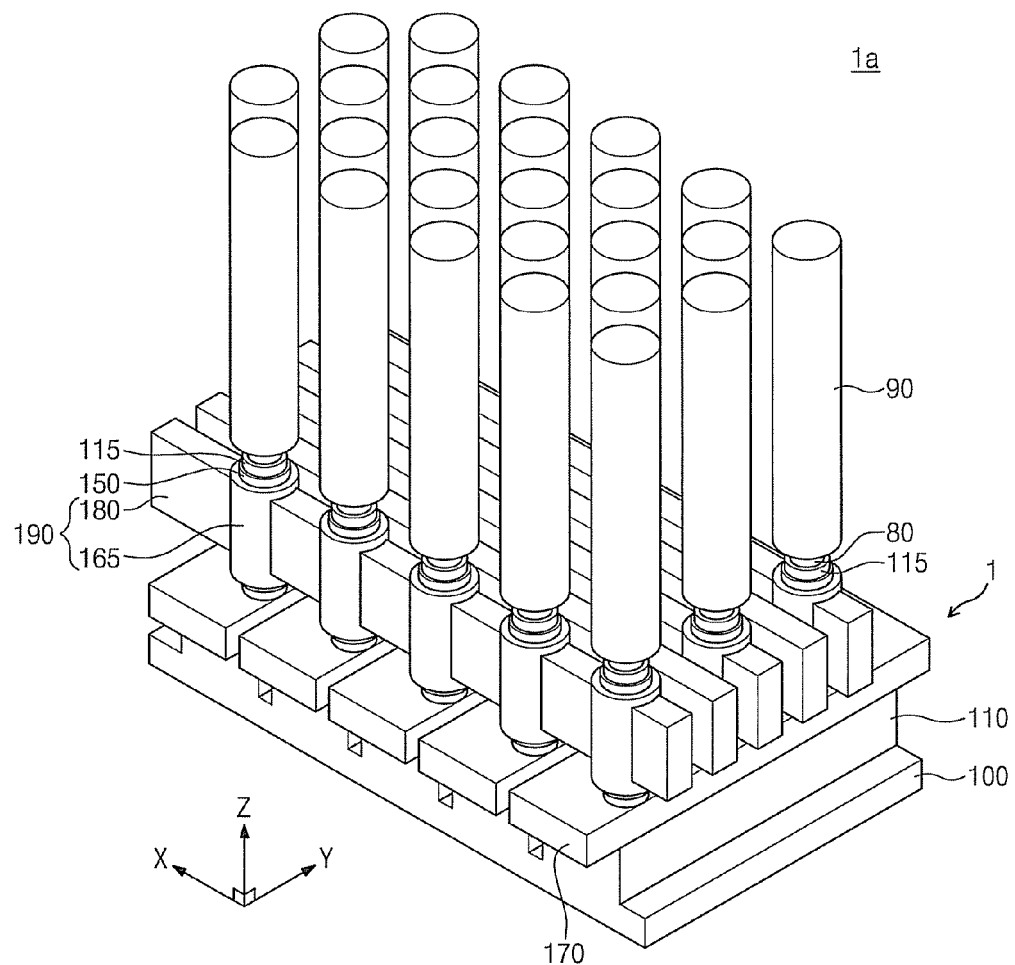
FIG. 2 is a perspective view of a semiconductor device to which the vertical channel transistor shown in FIG. 1 is applied.

FIG. 2 is a perspective view of a semiconductor device to which the vertical channel transistor 1 shown in FIG. 1 is applied. Referring to FIG. 2, a capacitor 90 may be connected to the vertical channel transistor 1 to implement a semiconductor device 1a, for example, a DRAM. The capacitor 90 may be electrically connected to the vertical channels 115. A contact plug 80 may be further included between the capacitor 90 and the vertical channels 115. The vertical channel transistor 1 may be applied to not only a memory but also a non-memory, e.g., a central processing unit (CPU).

Figure 3:
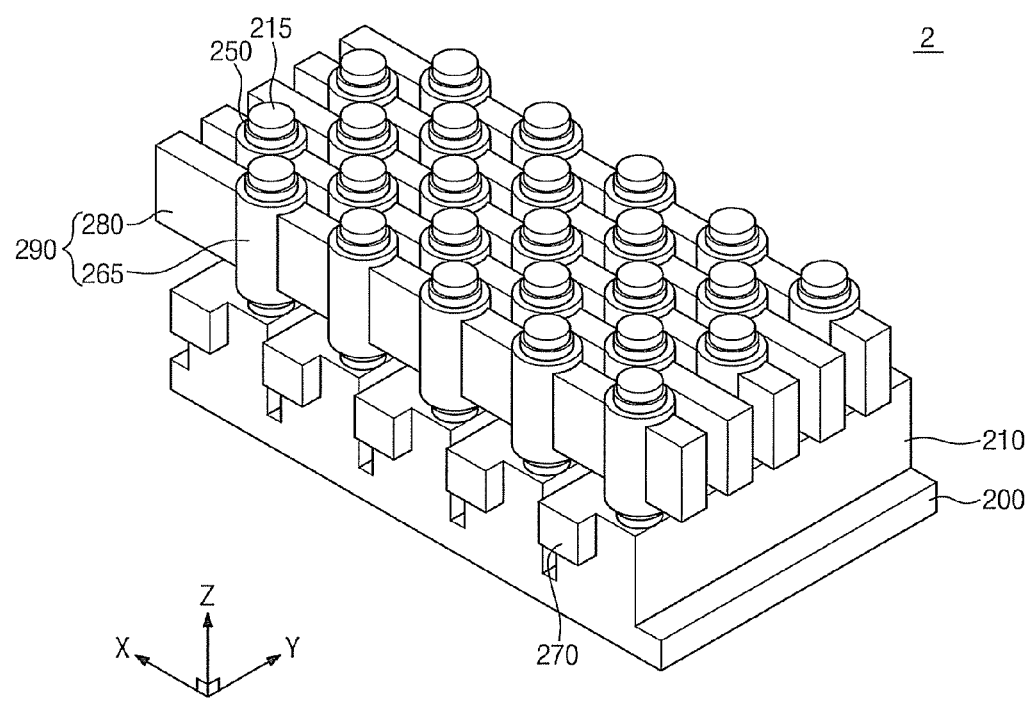
FIG. 3 is a perspective view of a vertical channel transistor according to example embodiments of the inventive concepts.

FIG. 3 is a perspective view of a vertical channel transistor 2 according to example embodiments of the inventive concepts. As illustrated, the vertical channel transistor 2 may include an active layer 210, vertical channels 215, a gate dielectric layer 250, and a wordline 290 including a wordline plug-in 280 connecting gate electrodes 265 on a semiconductor substrate 200, which are identical or similar to those of the vertical channel transistor 1 shown in FIG. 1. Characteristics, e.g., current driving capability, gate length reproducibility, and a wordline bridge, will be understood with reference to a method for fabricating the vertical channel transistor 2 according to example embodiments of the inventive concepts which will be described later with reference to FIGS. 20A/B to 24A/B.

Unlike the vertical channel transistor 1 shown in FIG. 1, a buried bitline 270 may be formed of a conductive material and have a zigzag pattern which occupies an upper edge portion of the active layer 210. Thus, the buried bitline 270 may extend in a different shape (e.g., zigzag shape) from the active layer 210 in the Y direction. The buried bitline 270 may be offset with the vertical channels 215 arranged in a zigzag pattern in the Y direction.

Figure 4:
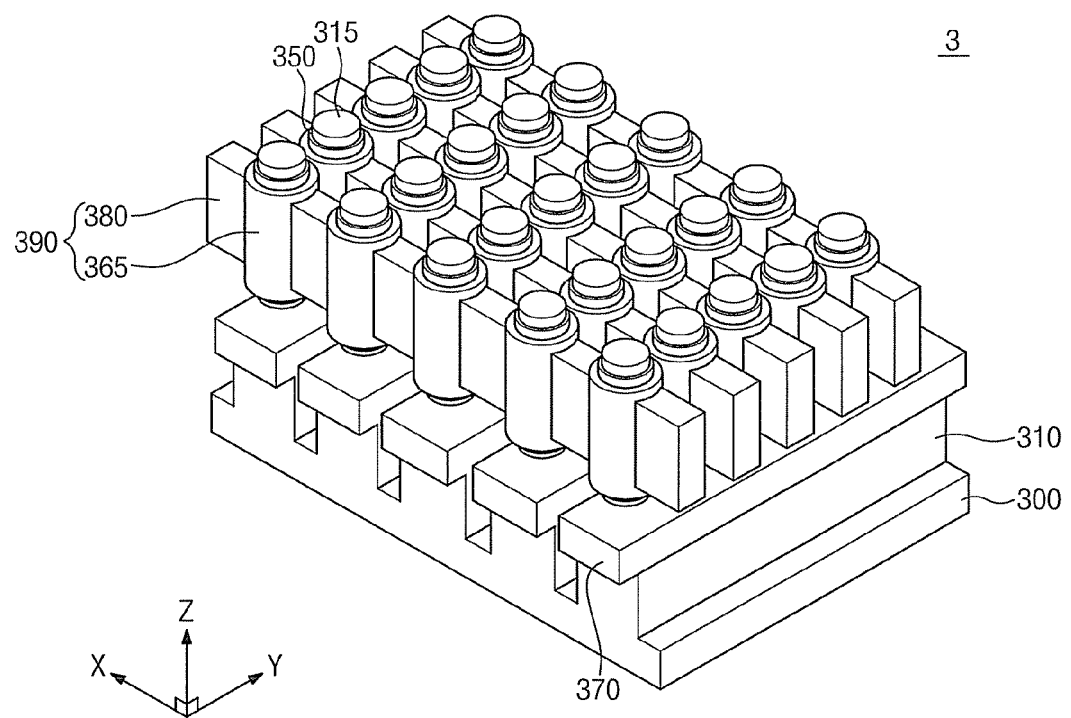
FIG. 4 is a perspective view of a vertical channel transistor according to example embodiments of the inventive concepts.

FIG. 4 is a perspective view of a vertical channel transistor 3 according to example embodiments of the inventive concepts. As illustrated, the vertical channel transistor 3 may include an active layer 310, a gate dielectric layer 350, and a wordline 390 including a wordline plug-in 380 connecting gate electrodes 365 on a semiconductor substrate 300, which are identical or similar to those of the vertical channel transistor 1 shown in FIG. 1. Unlike the vertical channel transistor 1 shown in FIG. 1, vertical channels 315 may be arranged straightly along the edge of the active layer 310 in the Y direction. The vertical channel transistor 3 may be implemented by a fabricating method which will be described later with reference to FIGS. 25A/B to 27A/B or a similar fabricating method.

Figure 5:
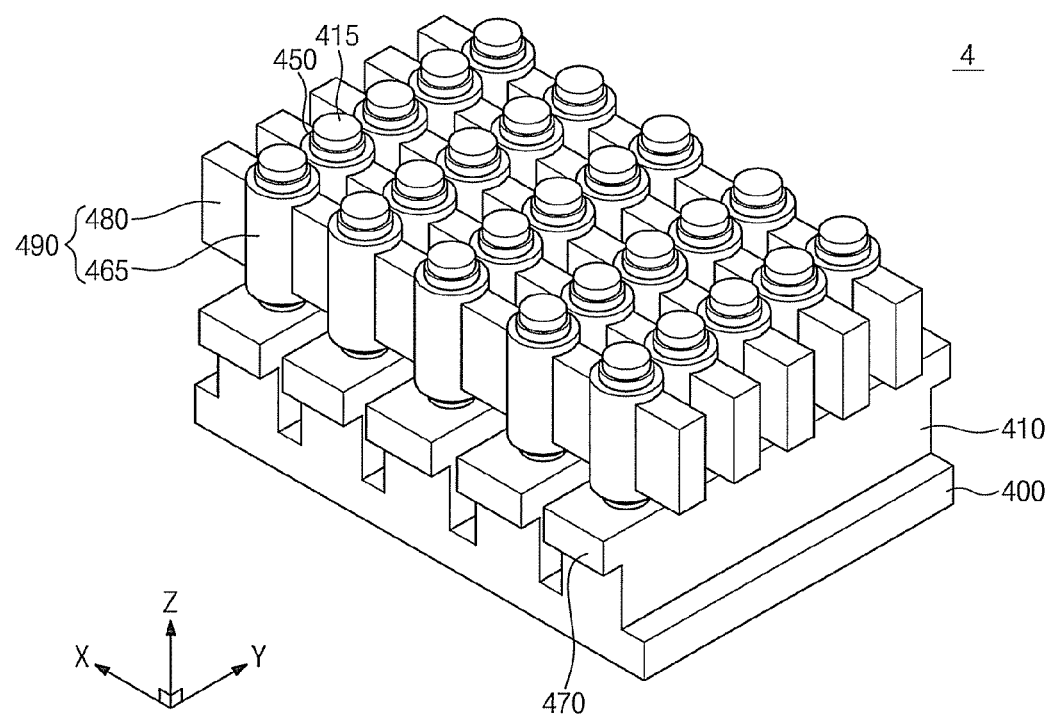
FIG. 5 is a perspective view of a vertical channel transistor according to example embodiments of the inventive concepts.

FIG. 5 is a perspective view of a vertical channel transistor 4 according to example embodiments of the inventive concepts. As illustrated, unlike the vertical channel transistor 3 shown in FIG. 4, vertical channels 415 may be arranged straightly along the center of an active layer 410 in the Y direction. Except this, the vertical channel transistor 4 may be identical or similar to the vertical channel transistor 3 shown in FIG. 4. The implementation of the vertical channel transistor 4 according to example embodiments of the inventive concepts may be understood with reference to a fabricating method which will be described later with reference to FIGS. 28A/B to 30A/B.

Figure 6:
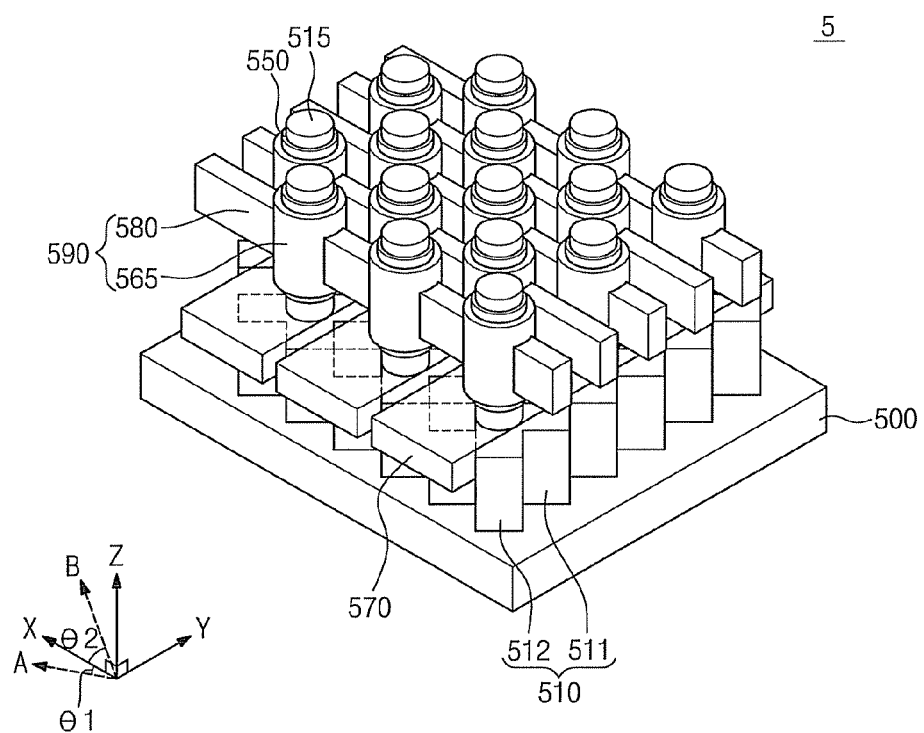
FIG. 6 is a perspective view of a vertical channel transistor according to example embodiments of the inventive concepts.

FIG. 6 is a perspective view of a vertical channel transistor 5 according to example embodiments of the inventive concepts. As illustrated, the vertical channel transistor 5 includes an active layer 510 having a pattern whose shape is identical or similar to a diamond (rhombus) or a honeycomb pattern (hereinafter referred to as "honeycomb pattern") where a plurality of first active layers 511 extending in an A direction and a plurality of second active layers 512 extending in a B direction. The A direction may intersect the B direction at roughly a right angle. The A and B directions and an X direction may intersect at an angle lower than the right angle. As an example, an angle θ1 between the A direction and the X direction and an angle θ2 formed the B direction and the X direction may be roughly 45 degrees.

A plurality of vertical channels 515 may vertically protrude from the active layer 510 in the Z direction. The vertical channels 515 may share an intersection of a first active layer 511 and a second active layer 512. Thus, the vertical channels 515 may appear to be arranged in a zigzag pattern on a semiconductor substrate 500. The shape of the active layer 510 and the position of the vertical channels 515 may be understood more clearly with reference to FIGS. 31A and 32A.

Wordlines 590 may extend in the X direction, and buried bitlines 570 may extend in the Y direction. The wordlines 590 may include gate electrodes 565 surrounding the vertical channels 515 and wordline plug-ins 580 connecting gate electrodes 565. The buried bitline 570 may be made of a conductive material occupying an upper end portion of the active layer 510. One buried bitline 570 may be electrically connected to two groups of vertical channels 515 arranged in a straight line in the Y direction. The vertical channel transistor 5 according to example embodiments of the inventive concepts may be implemented by a method which is identical or similar to a fabricating method which will be described later with reference to FIGS. 31A/B to 36A/B.

According to example embodiments of the inventive concepts, the vertical channels 515 may be arranged to form a honeycomb pattern, not a square pattern. Thus, the width of the buried bitline 570 may be extended to reduce its resistance. This will be now described below in detail with reference to FIGS. 41A and 41B.

Figure 41A:
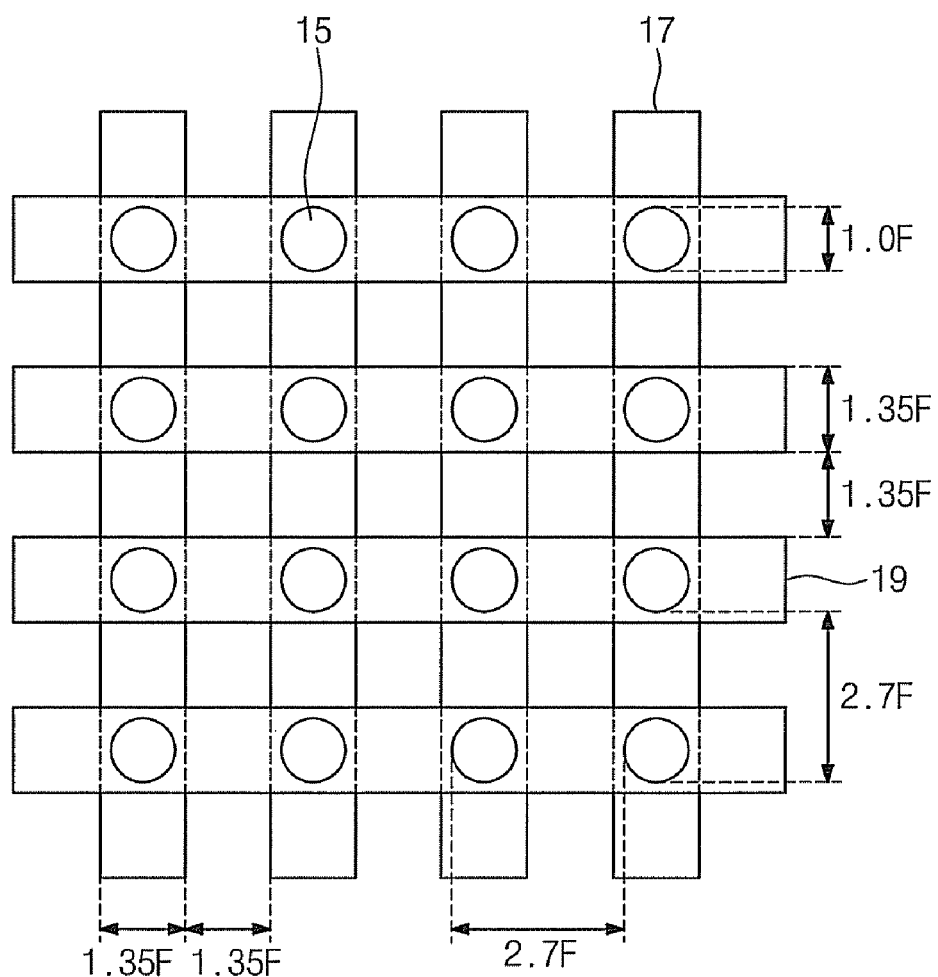
FIGS. 41A and 41B are top plan views illustrating a difference between pitches of buried bitlines in vertical channel transistors according to a conventional art and example embodiments of the inventive concepts, respectively.
Figure 41B:
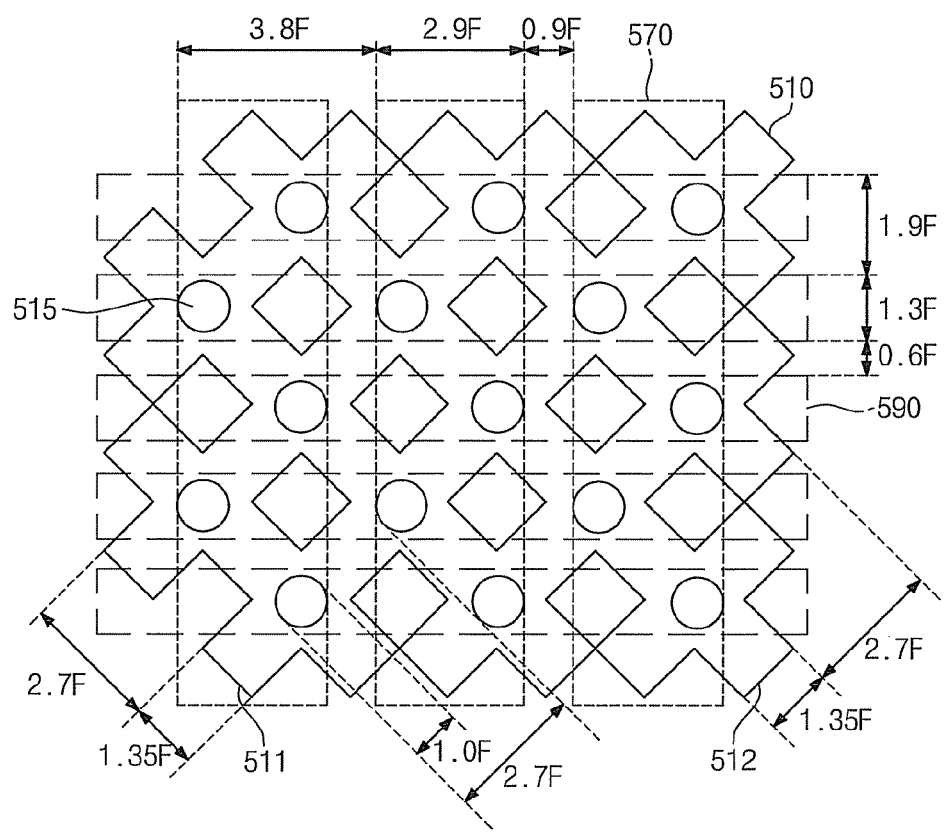

FIGS. 41A and 41B are top plan views illustrating a difference between pitches of buried bitlines in vertical channel transistors according to a conventional art and example embodiments of the inventive concepts, respectively.

Referring to FIG. 41A illustrating the conventional art, when each of vertical channels 15 constitutes a square pattern having a size of 1.0 F (e.g., 50 nm) and a pitch of 2.7 F (e.g., 135 nm), a wordline 19 may be designed to have a width and pitch of 1.35 F (e.g., 67.5 nm) and a buried bitline 17 may also be designed to have a width and pitch of 1.35 F. An active layer may extend along a pattern that is identical or similar to the buried bitline 17, e.g., lengthwise of the buried bitline 17 and may exhibit the form of a line which overlaps or offsets with the buried bitline 17. Because there is a limit in increasing width of the buried bitline 17, there may be an issue where resistance of the buried bitline 17 increases with improvement of integration density.

Referring to FIG. 41B, when an active layer 510 constituting a honeycomb pattern is designed to have width of 1.35 F and a vertical channels 515 is designed to have a size of 1.0 F and a pitch of 2.7 F, a wordline 590 may be formed to have a width of 1.3 F, a pitch of 1.9 F, and distance of 0.6 F from another wordline 590 and a buried bitline 570 may be formed to have width of 2.9 F, a pitch of 3.8 F, and a distance of 0.9 F from another buried bitline 570. As compared to FIG. 41A, although the vertical channels 515 of a honeycomb pattern and the vertical channels 15 of a square pattern are equal in size and pitch, width of the buried bitline 570 may increase to 2.9 F from 1.35 F when the active layer 510 is formed in a honeycomb pattern. Thus, the active layer 570 may have lower resistance.

Figure 7:
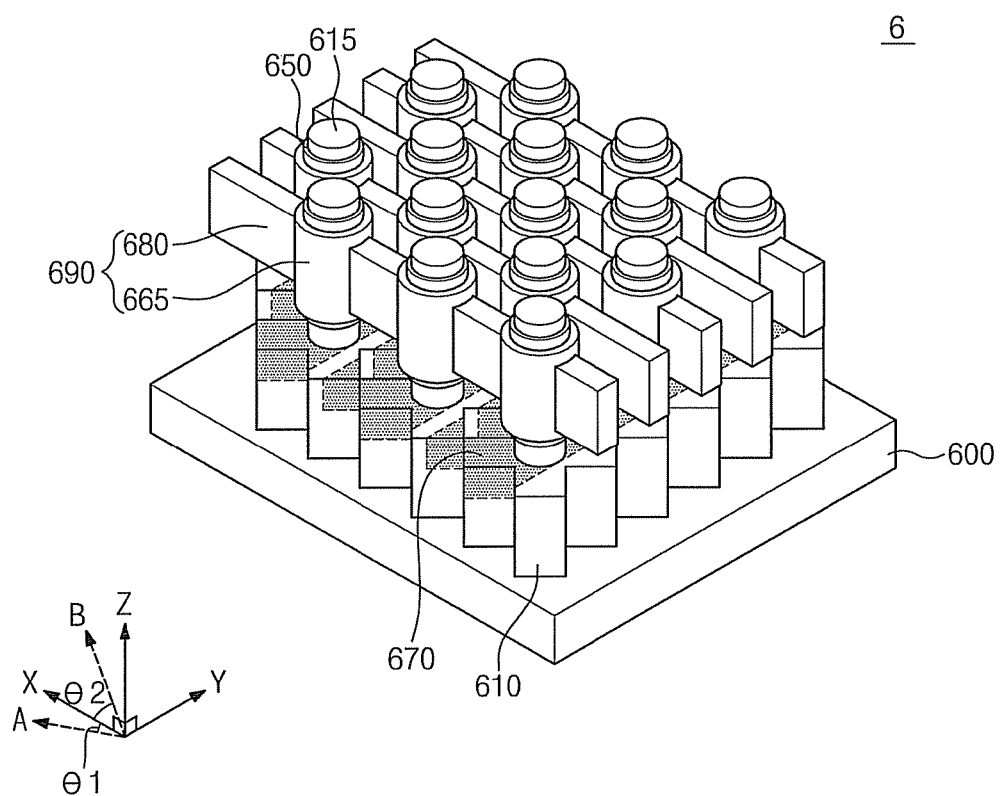
FIG. 7 is a perspective view of a vertical channel transistor according to example embodiments of the inventive concepts.

FIG. 7 is a perspective view of a vertical channel transistor 6 according to example embodiments of the inventive concepts. Unlike the vertical channel transistor 5 shown in FIG. 6, the vertical channel transistor 6 may include an active layer 610 whose top end portion is a buried bitline 670. Thus, the buried bitline 670 may be a honeycomb pattern which is identical or similar to the shape of the active layer 610. For example, the buried bitline 670 may be formed by introducing ions into an upper end portion of the active layer 610. Except for this, the vertical channel transistor 6 may be identical or similar to the vertical channel transistor 5 shown in FIG. 6. The vertical channel transistor 6 according to example embodiments of the inventive concepts will be implemented a fabricating method which will be described later with reference to FIGS. 37A/B to 40A/B or a similar fabricating method.

FIGS. 8A to 17A are top plan views illustrating a method for fabricating a vertical channel transistor according to example embodiments of the inventive concepts, and FIGS. 8B to 17B are cross-sectional views taken along the line I-I' in FIGS. 8A to 17A, respectively.

Figure 8A:
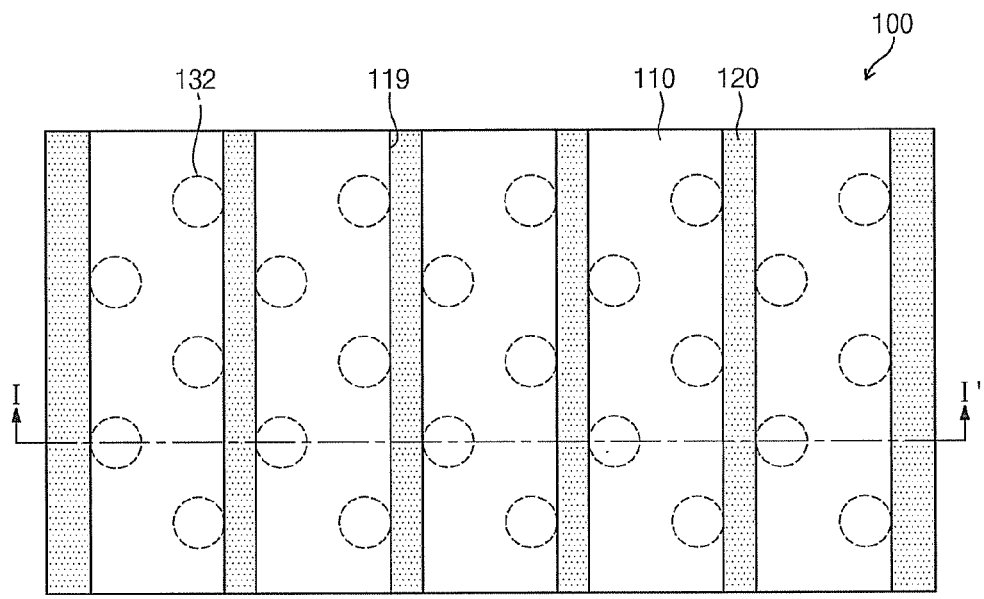
Figure 8B:
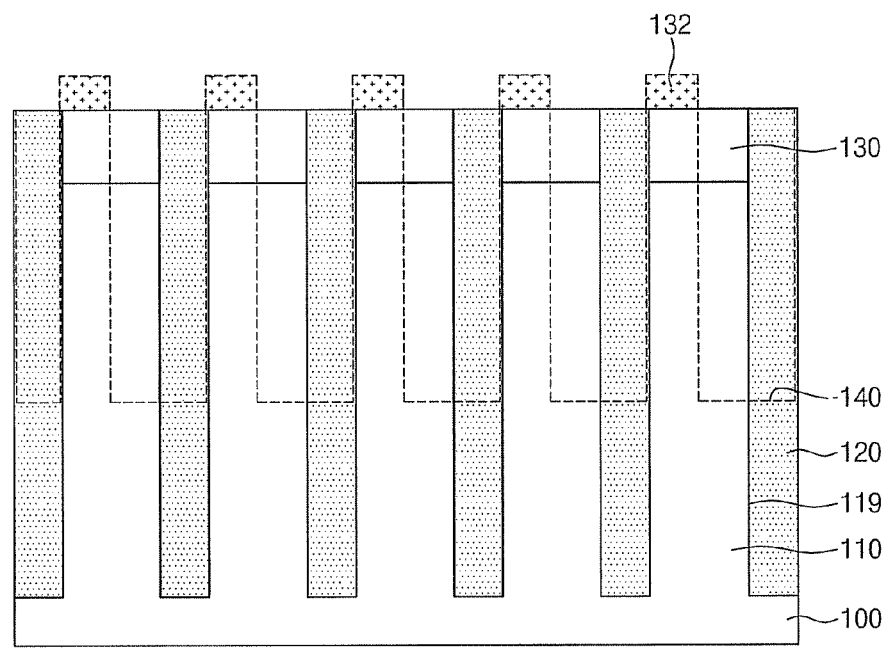

Referring to FIGS. 8A and 8B, a plurality of active layers 110 are formed on a semiconductor substrate 100. The active layers 110 may protrude from the semiconductor substrate 100 in a vertical direction (Z direction in FIG. 1A). The active layers 110 may extend in a direction that is substantially perpendicular to the line I-I' (Y direction in FIG. 1A) and may be in the form of lines arranged lengthwise of the line I-I' (X direction in FIG. 1A). The active layer 100 may be defined by forming a trench 119 on the semiconductor substrate 100 and filling the trench 119 with an insulating layer 120. As an example, a hard mask layer 130 may be formed on the semiconductor substrate 100 to extend in a direction that is perpendicular to the line I-I' and a portion of the semiconductor substrate 100 may be removed by a dry etch process using the hard mask 130 to form the trench 119. The hard mask 130 may be formed by depositing silicon nitride (e.g., SiN). The semiconductor substrate 100 may be a single-crystalline silicon wafer or a silicon-on-insulator (SOI) substrate. The active layers 110 may be formed of single-crystalline silicon. The semiconductor substrate 100 and the active layers 110 may be doped with impurities of first conductivity type (e.g., P-type). The insulating layer 120 may be formed by depositing a layer of silicon oxide (e.g., $SiO_2$), silicon nitride (e.g., SiN or $Si_3N_4$), silicon oxynitride (SiON) or a combination thereof and planarizing the deposited layer. In this specification, the insulating layer 120 will be referred to as a device isolation layer. The device isolation layer 120 may be planarized by a chemical mechanical polishing (CMP) process.

Photoresist masks 132 may be formed to define a damascene pattern 140. The photoresist masks 132 may be formed separately in a zigzag pattern on any one of the active layers 110.

Figure 9A:
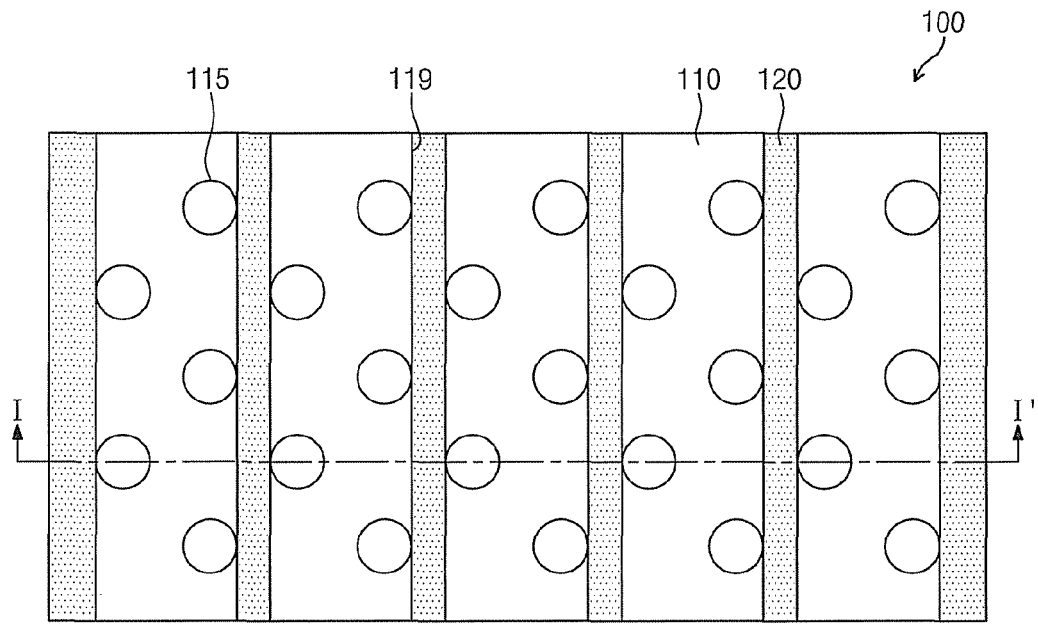
Figure 9B:
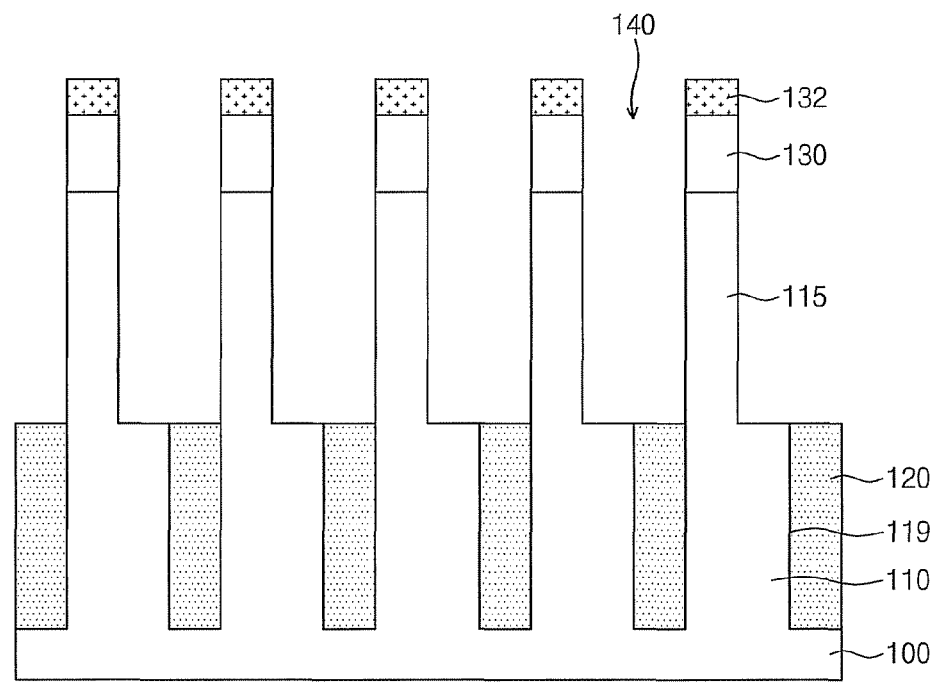

Referring to FIGS. 9A and 9B, the active layer 110 may be patterned to faun vertical channels 115. As an example, the damascene pattern 140 may be formed by an etch process using the photoresist mask 132 to be shallower than the device isolation layer 120. The damascene pattern 140 may be formed by dry etching the active layer 110 and the device isolation layer 120 without an etch selectivity. With the formation of the damascene pattern 140, the vertical channels 115 may be formed of a portion of the active layer 110. Vertical channels 115 may be arranged in a zigzag pattern on the active layer 110. The vertical channels 115 may exhibit the shape of cylinder that is adjacent to the edge of the active layer 110 and may protrude in a vertical direction. The vertical channels 115 may have any horizontal section, e.g., a surface of an elliptic cylinder or square pillar. The photoresist mask 132 may be removed by an ashing process.

Figure 10A:
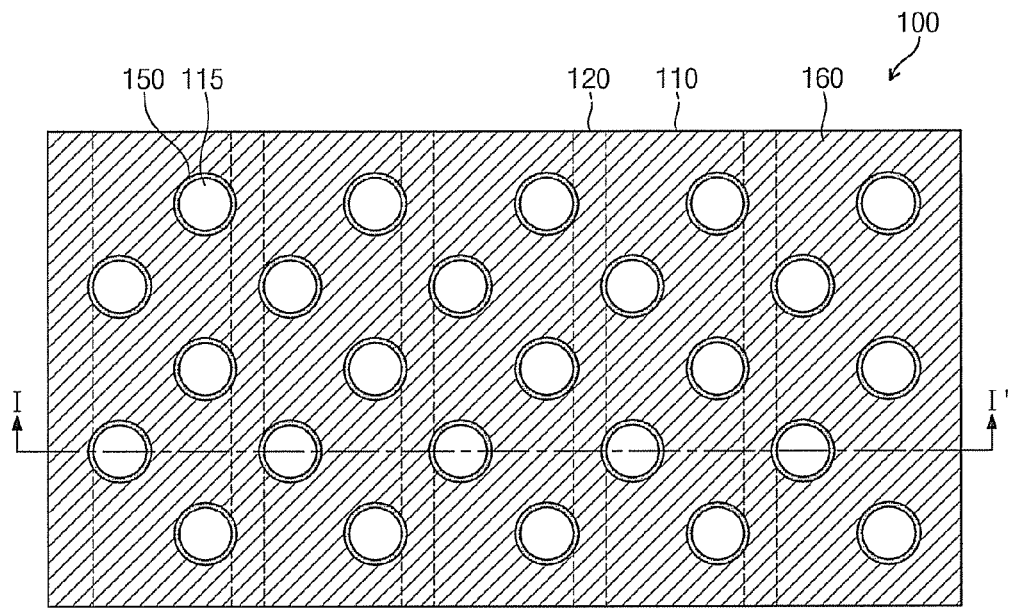
Figure 10B:
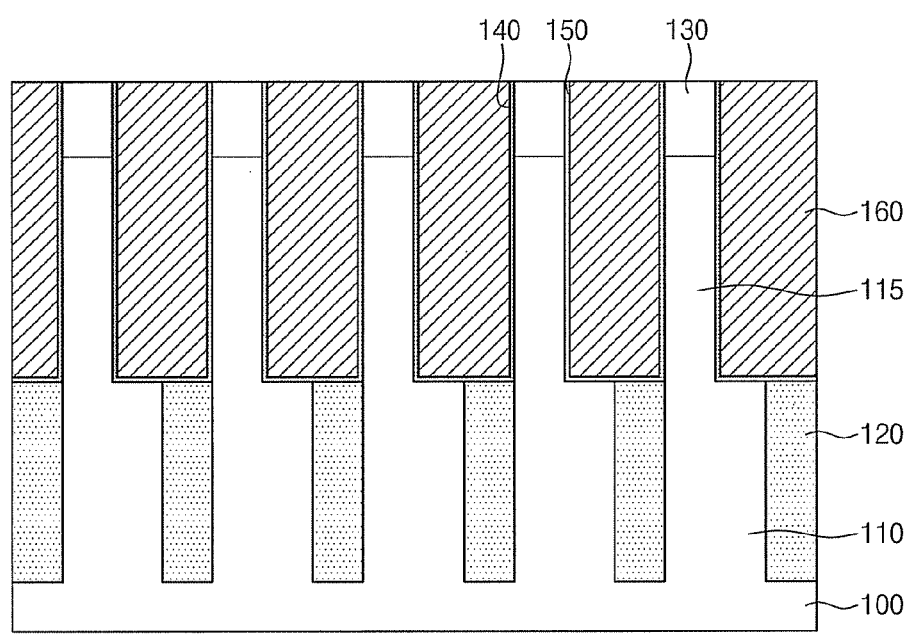

Referring to FIGS. 10A and 10B, a gate dielectric layer 150 may be formed to surround the sidewall of the vertical channels 115 and the damascene pattern 140 may be buried in a gate conductive layer 160. The gate dielectric layer 150 may be formed by a deposition process of silicon oxide (e.g., $SiO_2$) or a thermal oxidation process of the sidewall of the vertical channels 110 exposed by the damascene pattern 140. The gate dielectric layer 150 may be formed on not only the sidewall of the vertical channels 115 but also a top surface of the active layer 110. The gate conductive layer 160 may be formed by depositing doped polysilicon or a metal (e.g., TiN, W or $WSi_x$). After depositing the gate conductive layer 160, a planarization process (e.g., CMP process) may be further performed to expose the hard masks 130.

Figure 11A:
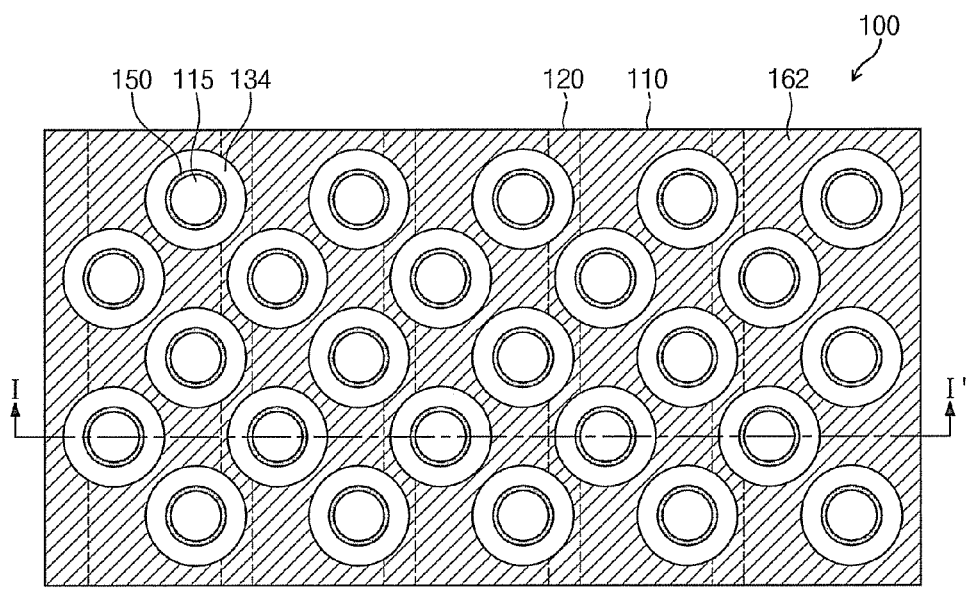
Figure 11B:
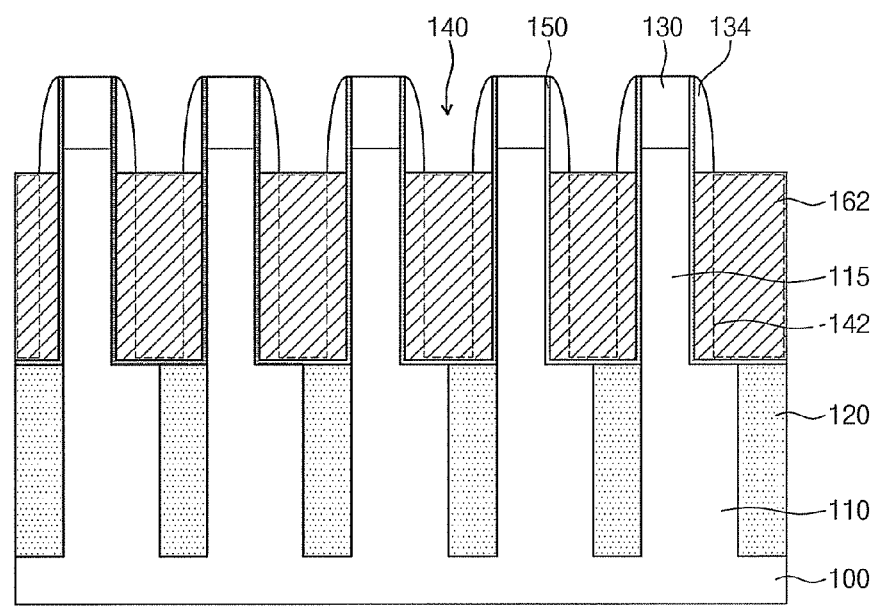

Referring to FIGS. 11A and 11B, a recessed gate conductive layer 162 may be formed to expose an upper portion of the vertical channels 115 and a gate spacer 134 may be formed on an upper end sidewall of the vertical channels 115. As an example, the recessed gate conductive layer 162 may be implemented by an etch-back process for the gate conductive layer 160. The etch-back process for the gate conductive layer 160 may allow the length (vertical height) of the recessed gate conductive layer 162 to be controlled precisely. The gate spacer 134 may be formed by depositing and patterning silicon oxide or silicon nitride. The gate spacer 134 may also be formed on the sidewall of the hard mask 130.

The recessed gate conductive layer 162 exposed by the damascene pattern 140 may be removed to form a gate isolation pattern 142, which is accomplished by gate isolation etching. Because the hard mask 130 and the gate spacer 134 may be used as masks during the gate isolation etching, a step of forming a mask may be omitted. The gate isolation etching may employ a dry etching process.

Figure 12A:
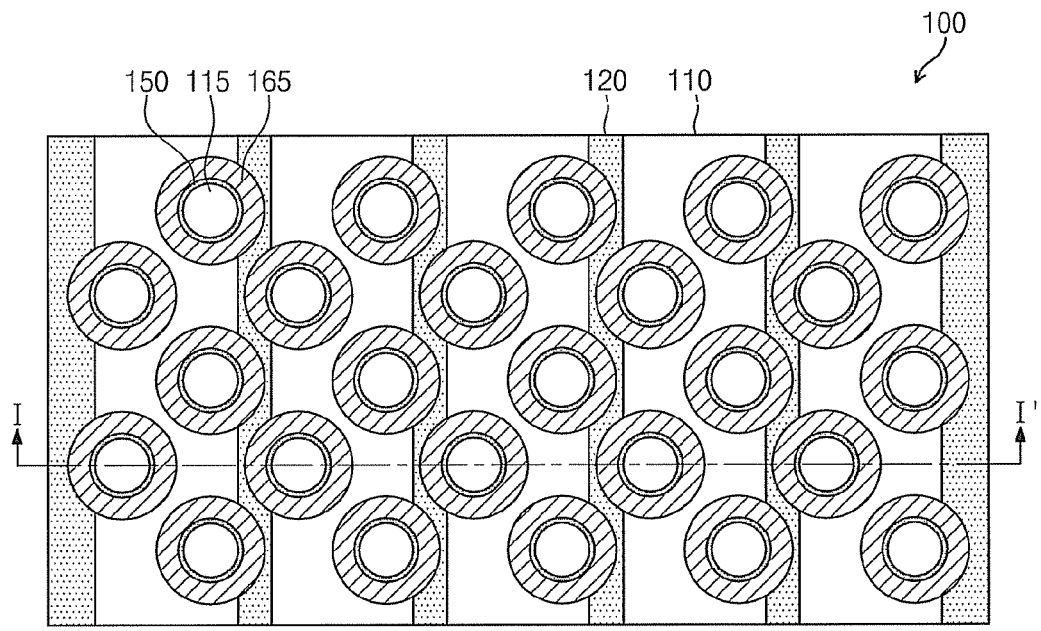
Figure 12B:
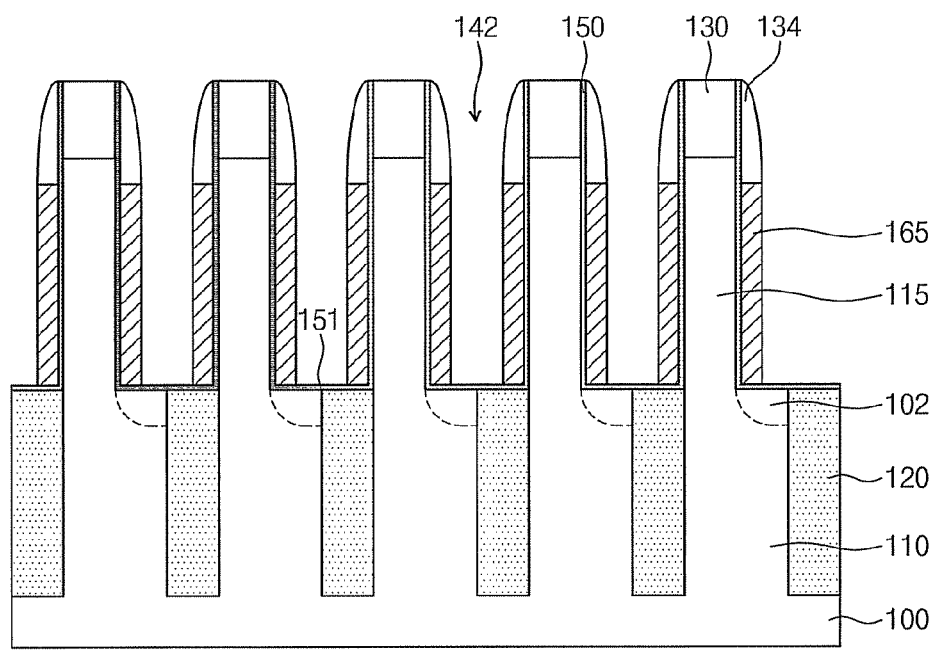

Referring to FIGS. 12A and 12B, according to the gate isolation etching, the recessed gate conductive layer 162 covered with the gate spacer 134 may be transformed into a gate electrode 165 surrounding the sidewall of the vertical channels 115. Gate electrodes 165 may be isolated by the gate isolation pattern 142. According to example embodiments of the inventive concepts, due to the gate isolation etching, the gate electrode 165 may be formed in a self-aligned manner and the length (vertical height) of the gate electrode 165 may be precisely controlled to secure reproducibility of the gate electrode 165. In addition, because the gate electrode 165 may be isolated by the gate isolation pattern 142, a bridge between the gate electrodes 165 may be avoided. During the gate isolation etching, an exposed portion 151 of the gate dielectric layer 150 may be overetched to expose the active layer 110.

A lower junction area 102 may be formed by implanting impurities into the active layer 110 below the gate isolation pattern 142. The lower junction area 102 may be doped with impurities of second conductivity type (e.g., N-type).

Figure 13A:
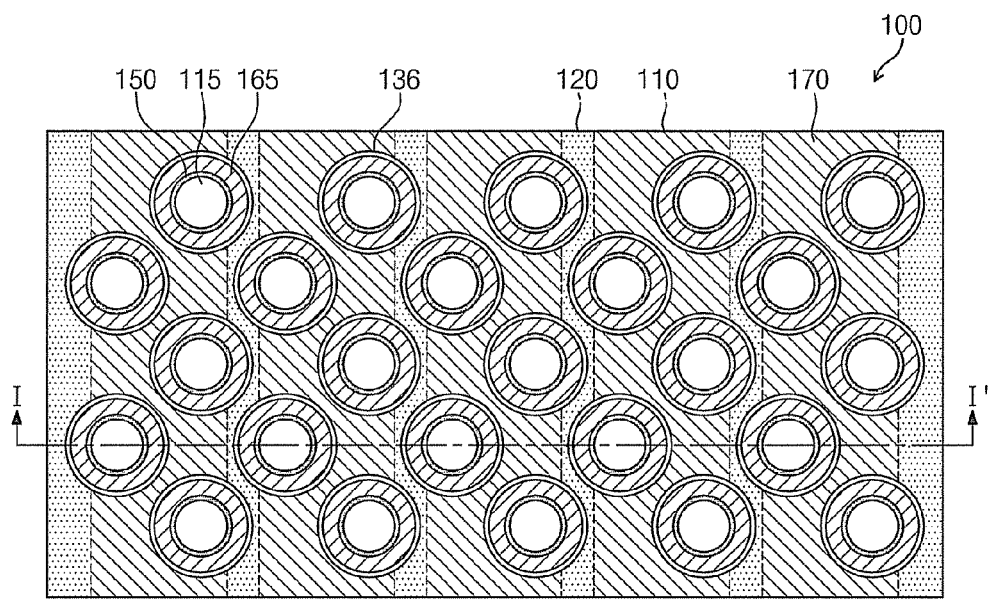
Figure 13B:
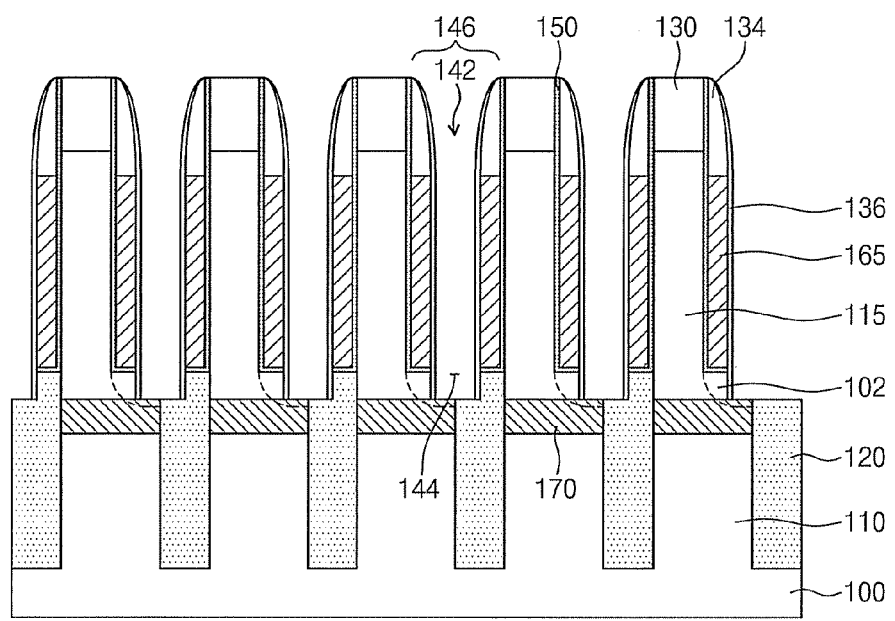

Referring to FIGS. 13A and 13B, a buried bitline pattern 144 may be formed below the gate isolation pattern 142. The buried bitline pattern 144 may be formed by removing the active layer 100 exposed by the gate isolation pattern 142 or by removing the active layer 110 and the device isolation layer 120 exposed by the gate isolation pattern 142. According to example embodiments of the inventive concepts, the buried bitline pattern 144 may be formed by dry-etching the exposed active layer 110 and the device isolation layer 120 without an etch selectivity. The buried bitline pattern 144 may be formed to be deeper or shallower than the lower junction area 102. An empty region including the gate isolation pattern 142 and the buried bitline pattern 144 will be hereinafter referred to as a gap 146.

A buried bitline 170 may be formed by implanting N-type impurities into the active layer 110 exposed by the buried bitline 144. An impurity concentration of the buried bitline 170 may be different from that of the lower junction area 102. For example, the impurity concentration of the buried bitline 170 may be higher than that of the lower junction area 102. The buried bitline 170 may be made of metal (e.g., $CoSi_x$) by siliciding the active layer 110 exposed by the buried bitline pattern 144. According to example embodiments of the inventive concepts, a plurality of buried bitlines 170 may be formed to have the identical or similar shape to the active layer 110. Width (lateral length) of the buried bitline 170 may be equal to or smaller than that of the active layer 110. Before forming the buried bitline 170, a passivation layer 136 may be further formed by depositing an insulator, e.g., silicon oxide or silicon nitride. The passivation layer 136 may prevent or reduce the lower junction area 102 exposed by the buried bitline pattern 144 and the gate electrode 165 from being further doped with impurities (e.g., metal or N-type impurities). A buried bitline (not shown) may be formed by filling the buried bitline pattern 144 with a conductive material through growth of doped polysilicon from the active layer 110 exposed by the buried bitline pattern 144 (selective epitaxial growth, SEG) or deposition of a conductive material, e.g., polysilicon or metal, which will be described later with reference to FIGS. 21A and 21B. According to the SEG or the conductive material deposition, a curved buried bitline may be formed to completely or partially fill the buried bitline pattern 144 and bypass the vertical channels 115 unlike the shape of the active layer 110.

Before forming the buried bitline pattern 144, an insulating layer (not shown) may be further formed on a sidewall of the gate electrode 165. The insulating layer may be formed by depositing an insulator, e.g., silicon oxide or silicon nitride, to have the shape of a liner covering the gate electrode 165 and the gate spacer 134. After forming the lower junction area 102 at a lower concentration doping level during the step of FIGS. 12A and 12B, the lower junction area 102 may be further heavily doped such that the lower junction area 102 may be formed to have a lightly doped drain (LDD) structure.

Figure 14A:
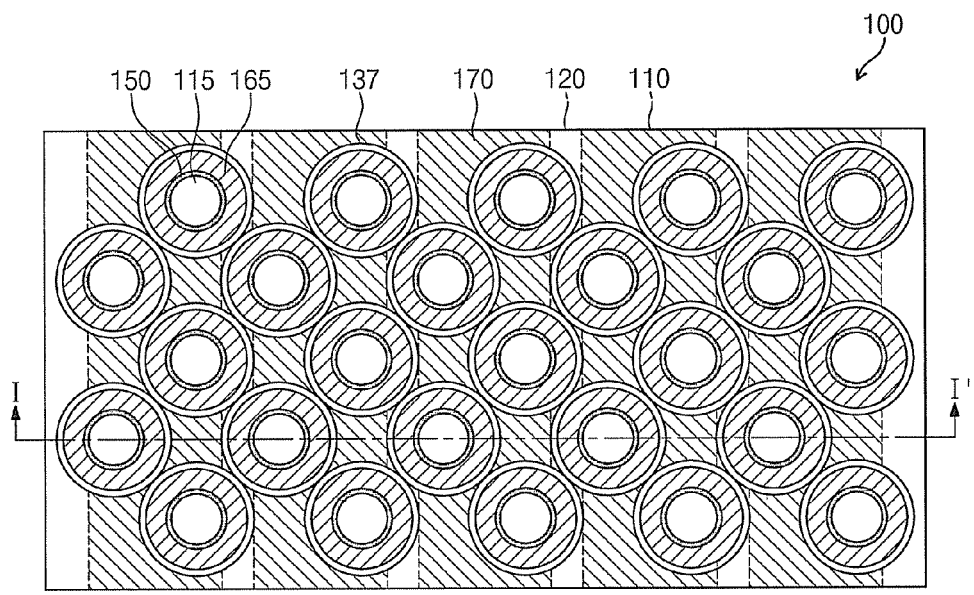
Figure 14B:
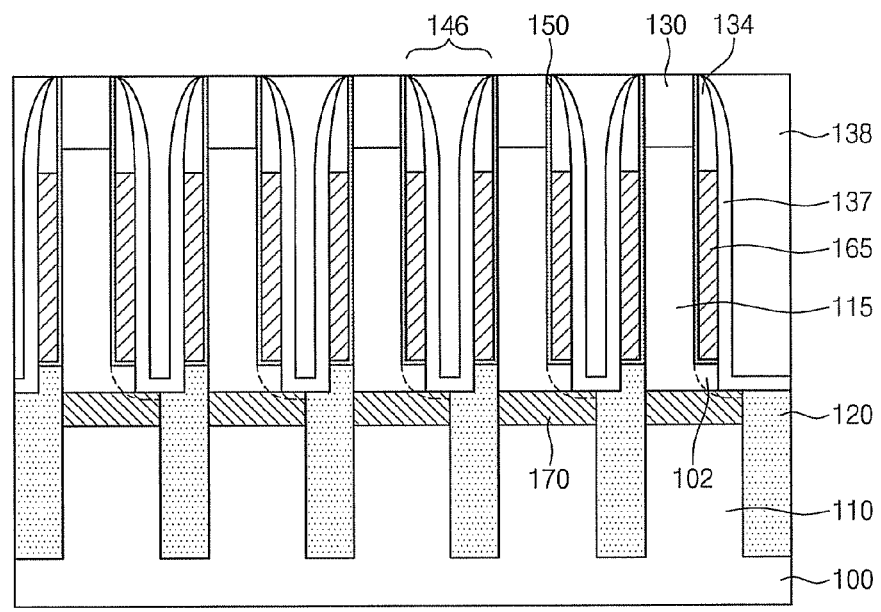

Referring to FIGS. 14A and 14B, the gap 146 between the vertical channels 115 may be filled with an insulator. As an example, after forming a liner 137 in the gap 146, the gap 146 may be completely filled with a gap-fill insulating layer 138. The liner 137 and the gap-fill insulating layer 138 may be formed of the same material or different materials among insulators, e.g., silicon oxide, silicon nitride, silicon oxynitride or a combination thereof. The liner 137 may be formed to conformally cover an inner sidewall of the gap 146. The gap-fill insulating layer 138 may be formed by depositing an insulator to completely fill the gap 146 and planarizing the deposited insulator by a CMP or etch-back process. As described in FIGS. 13A and 13B, although the passivation layer 136 may be further included in the gap 146, it is not shown for brevity of drawings.

Figure 15A:
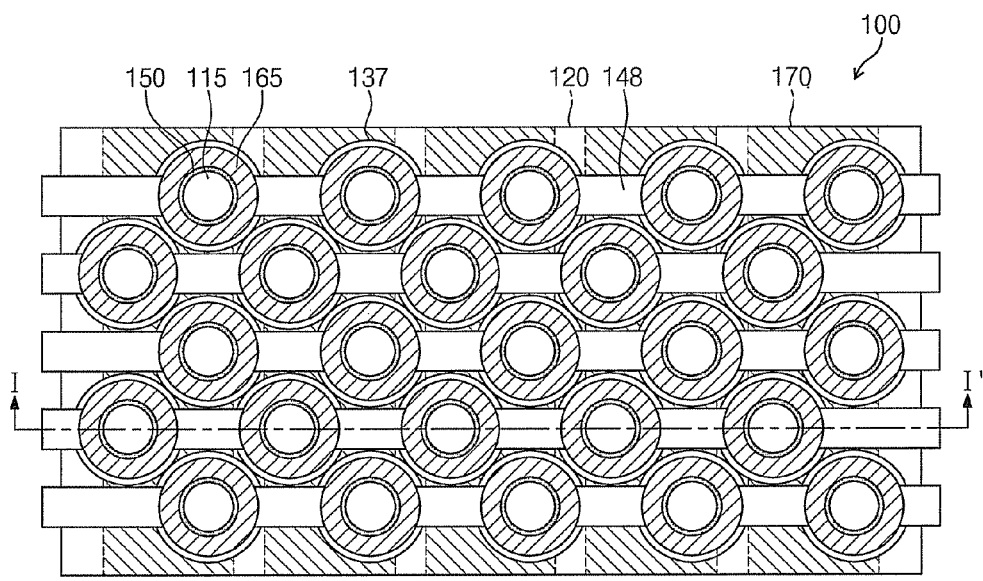
Figure 15B:
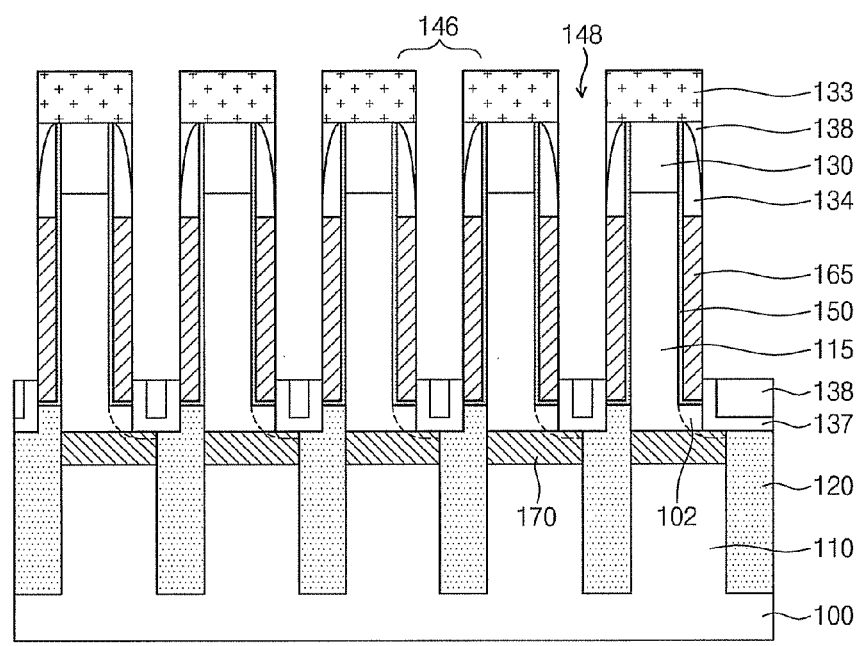

Referring to FIGS. 15A and 15B, a wordline contact pattern 148 may be formed. The wordline contact pattern 148 may be formed by recessing the liner 137 and the gap-fill insulating layer 138. After forming a photoresist mask 133 on the vertical channels 115, the liner 137 and the gap-fill insulating layer 138 may be partially removed by a dry etch process using the photoresist mask 133. The dry etch process may allow the liner 137 and the gap-fill insulating layer 138 to partially remain at a lower portion of the gap 146. The gap-fill insulating layer 138 may partially remain on the sidewall of the gate spacer 134. The wordline contact pattern 148 may be formed in form of a damascene discontinuously extending along the line I-I'. The sidewall of the gate electrode 165 may be exposed by the wordline contact pattern 148. The photoresist mask 133 may be removed by an ashing process.

Figure 16A:
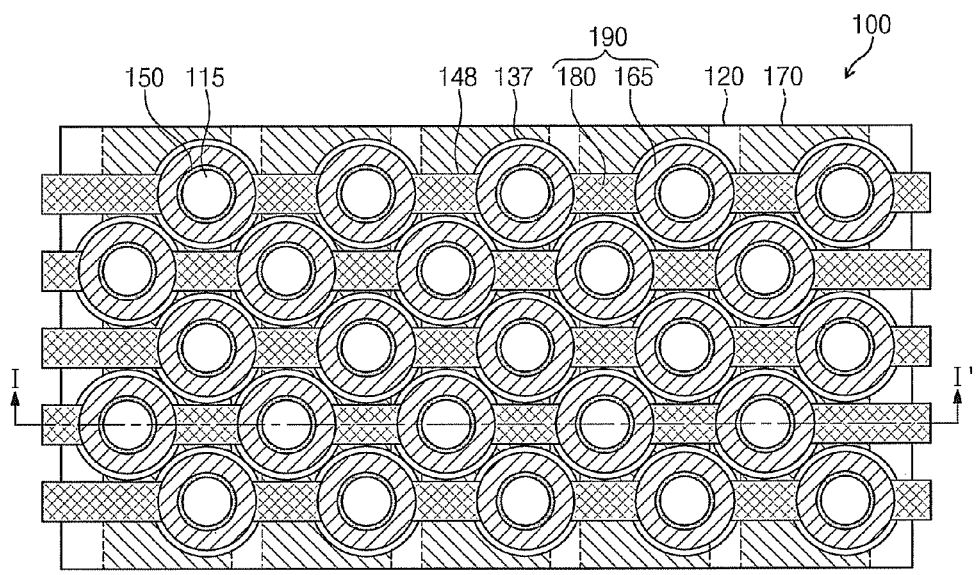
Figure 16B:
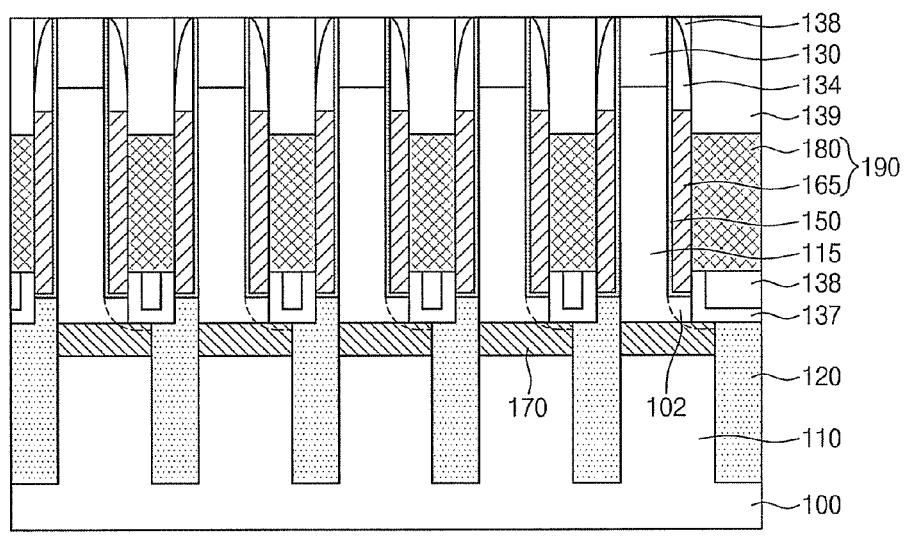

Referring to FIGS. 16A and 16B, a wordline plug-in 180 may be formed and then a capping insulating layer 139 may be formed to cover the wordline plug-in 180. As an example, after filling the wordline contact pattern 148 with a conductive material and planarizing the same, the conductive material may be etched back to faun the wordline plug-in 180. The wordline plug-in 180 may be formed of material identical to or different from that of the gate electrode 165. For example, the wordline plug-in 180 may be formed of doped polysilicon or a metal (e.g., TiN, W, and WSix). A vertical height of the wordline plug-in 180 may be equal to or different from that of the gate electrode 165. For example, the vertical height of the wordline plug-in 180 may be smaller than that of the gate electrode 165. The gate electrode 165 and the wordline plug-in 180 may be interconnected to implement a plurality of wordlines 190 that are in the form of lines extending along the line I-I'. The capping insulating layer 139 may be formed by depositing a layer of silicon oxide, silicon nitride, silicon oxynitride or a combination thereof and planarizing the deposited layer.

Figure 17A:
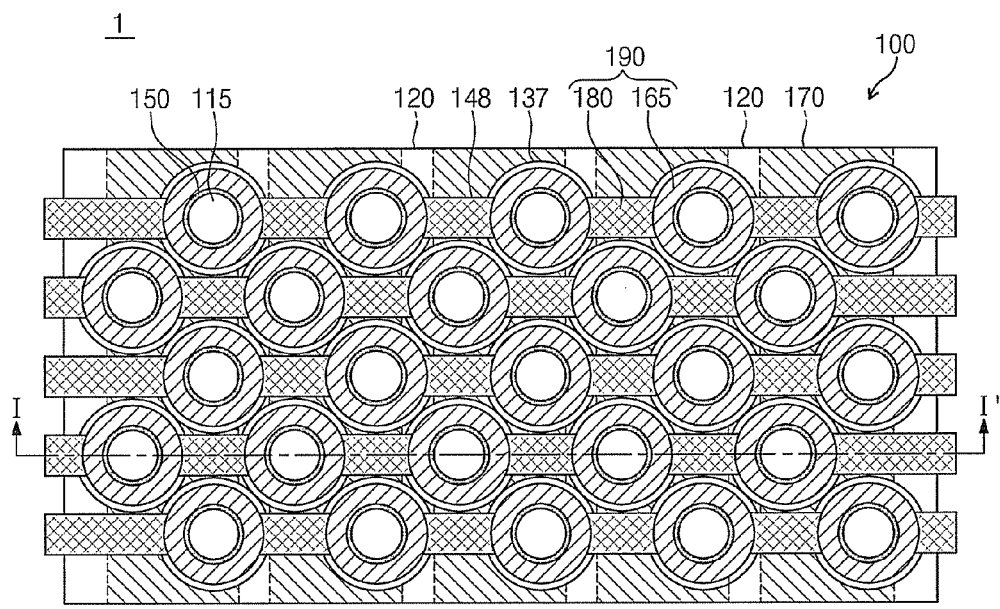
Figure 17B:
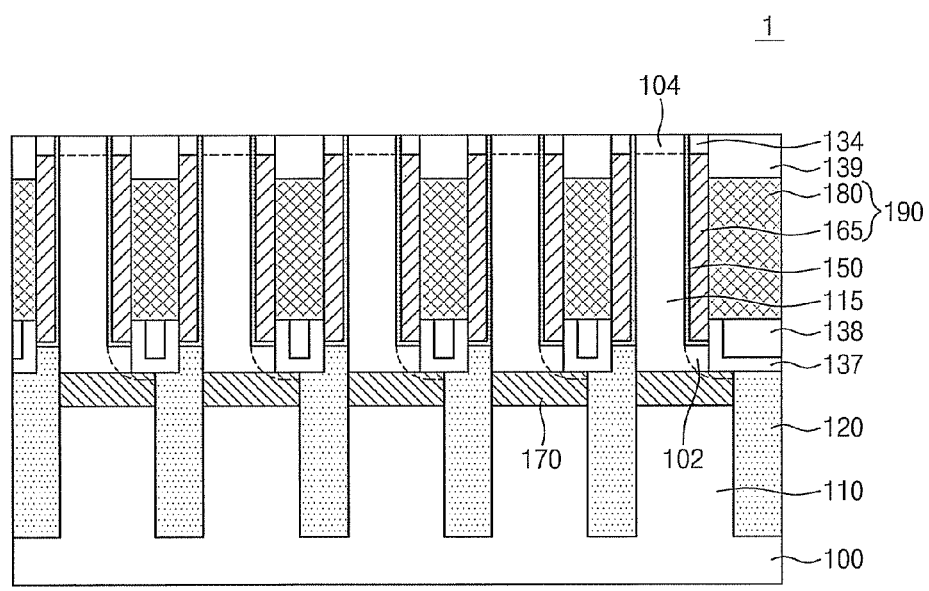

Referring to FIGS. 17A and 17B, the hard mask 130 may be removed. For example, the hard mask 130 may be removed down to a top surface of the vertical channels 115 by a planarization process employing etch-back or CMP. The gate spacer 136 and the capping insulating layer 139 may be partially removed by the planarization process. An upper junction area 104 may be formed by implanting, for example, N-type impurities into an upper portion of the vertical channels 115. According to example embodiments of the inventive concepts, because the separately formed vertical channels 115 may be exposed and surrounded by the capping insulating layer 139 and the gate spacer 134 by the planarization process, the ion implantation process may be carried out in a self-aligned manner. The upper junction area 104 may be lightly doped and heavily doped to be implemented as an LDD structure. According to the above series of processes, a vertical channel transistor 1 shown in FIG. 1 may be implemented which includes vertical channels 115 arranged in a zigzag pattern, line-shaped wordlines 190 are interconnected by the wordline plug-in 180 where gate electrodes 165 are formed in a self-aligned manner to surround the vertical channels 115, and buried bitlines 170 extend along the active layer 110.

Figure 18A:
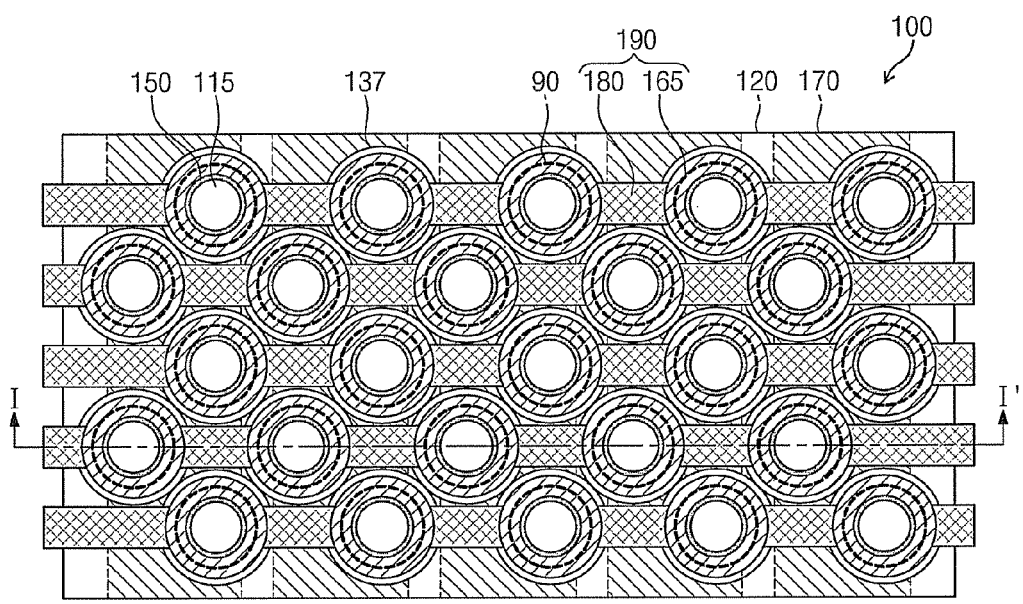
FIGS. 18A, 19A, and 19B are top plan views illustrating a method for fabricating a semiconductor device adopting a vertical channel transistor according to example embodiments of the inventive concepts.
Figure 18B:
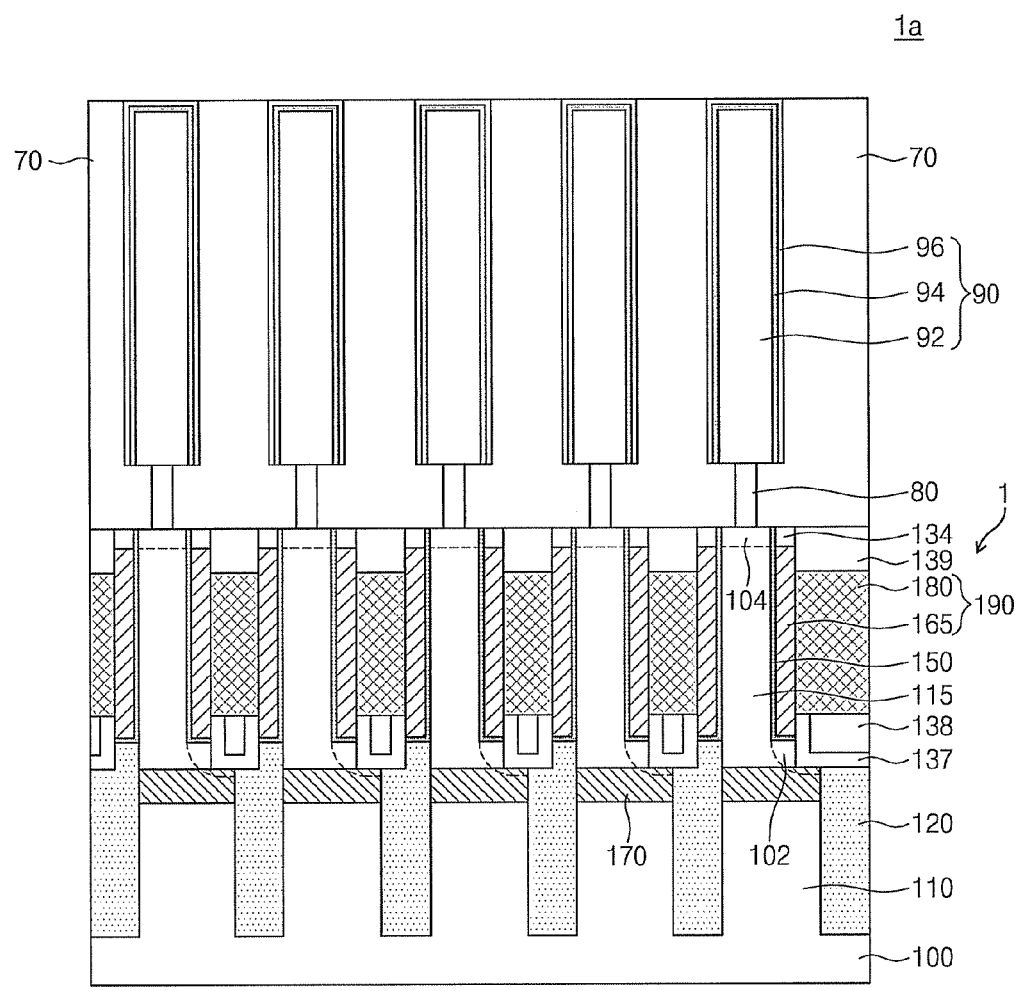
FIG. 18B is a cross-sectional view taken along the line I-I' in FIG. 18A.
Figure 19A:
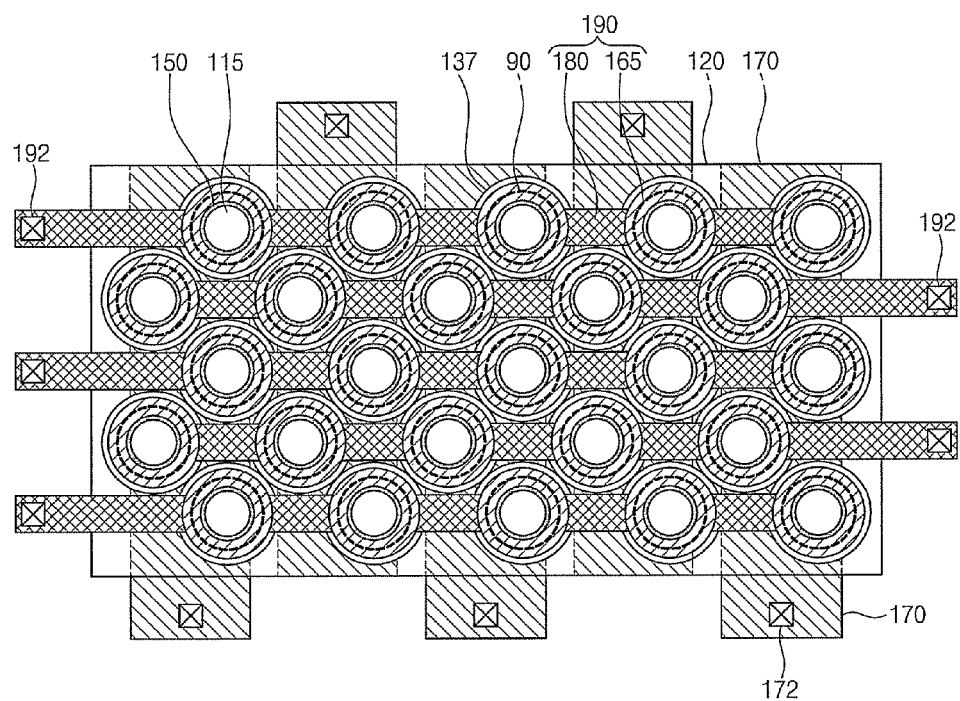
Figure 19B:
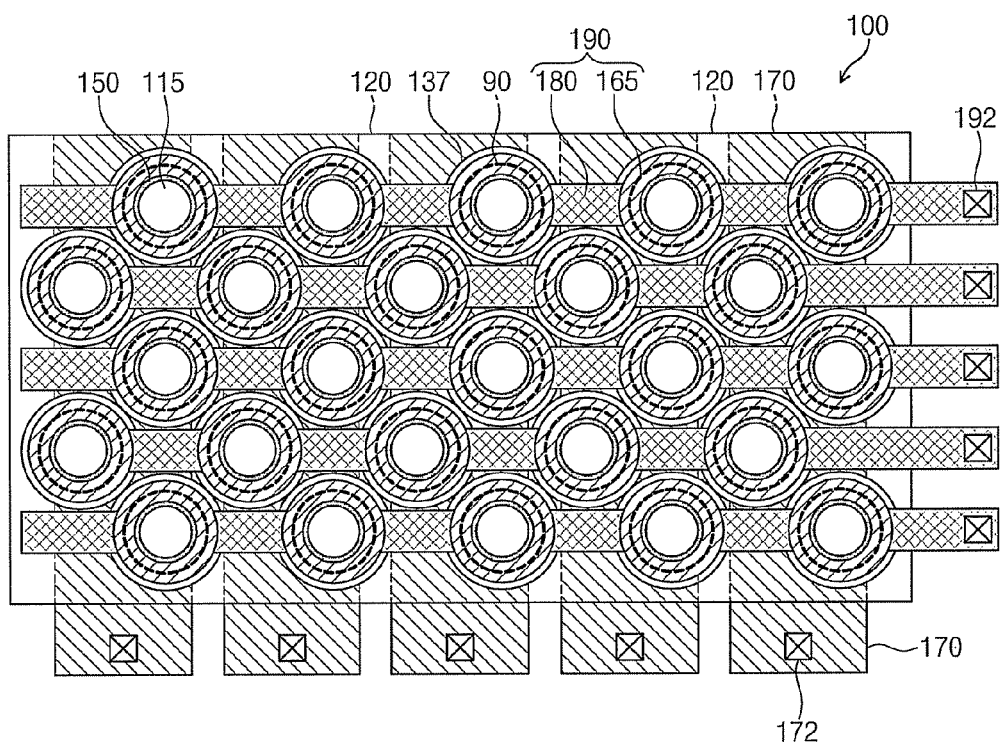

FIGS. 18A, 19A, and 19B are top plan views illustrating a method for fabricating a semiconductor device adopting a vertical channel transistor according to example embodiments of the inventive concepts, and FIG. 18B is a cross-sectional view taken along the line I-I' in FIG. 18A. The explanation below may be applied to other example embodiments of the inventive concepts.

Referring to FIGS. 18A and 18B, a semiconductor device 1a shown in FIG. 2, e.g., a DRAM, may be implemented by forming a capacitor 90 electrically connected to the vertical channel transistor 1. As an example, an interlayer dielectric 70 may be formed on the vertical channel transistor 1 and the capacitor 90 may be formed to be electrically connected to the upper junction area 104 through the interlayer dielectric 70. The capacitor 90 may be formed to exhibit the shape of cylinder where a dielectric layer 94 is interposed between a lower electrode 92 and an upper electrode 96. A contact plug 80 may be further formed between the lower electrode 92 and the upper junction area 104. As another example, the gate dielectric layer 150 may be substituted with an oxide-nitride-oxide (ONO) layer capable of trapping carriers or a phase-change material layer may be formed between the wordline 190 and the buried bitline 170 to utilize the vertical channel transistor 1 as a nonvolatile memory device.

Referring to FIG. 19A, a plurality of wordline contact plugs 192 may be formed at the plurality of wordlines 190, respectively. A plurality of bitline contact plugs 172 may be formed at a plurality of buried bitlines 170, respectively. The wordline 190 may be electrically connected to a peripheral circuit, e.g., a wordline driving circuit, through the wordline contact plug 192. The buried bitline 170 may be electrically connected to a peripheral circuit, e.g., a bitline driving circuit, by the bitline contact plug 172.

The wordline contact plugs 192 may be formed to be alternately arranged horizontally. For example, the contact plugs 192 may be formed at left sides of odd-column wordlines 190 and right ends of even-column wordlines 190. Similarly, the bitline contact plugs 172 may be formed to be alternately arranged vertically. For example, the bitline contact plugs 172 may be formed at lower ends of odd-row buried bitlines 170 and upper ends of even-row buried bitlines 170.

Referring to FIG. 19B, unlike FIG. 19A, the wordline contact plugs 192 and the bitline contact plugs 172 may be formed at one side, respectively. As an example, the wordline contact plugs 192 may be formed at right ends of the wordlines 190, and the bitline contact plugs 172 may be formed at lower ends of the buried bitlines 170. As another example, the wordline contact plugs 192 may be formed to be alternately arranged horizontally (see FIG. 19A) and the bitline contact plugs 172 may be formed to be arranged in one side (see FIG. 19B) or vice versa.

FIGS. 20A to 24A are top plan views illustrating a method for fabricating a vertical channel transistor according to example embodiments of the inventive concepts, and FIGS. 20B to 24B are cross-sectional views taken along the line II-II' in FIGS. 20A to 24A, respectively. Duplicate explanations will be omitted for the brevity of description, which will be equivalently applied to other example embodiments of the inventive concepts described later.

Figure 20A:
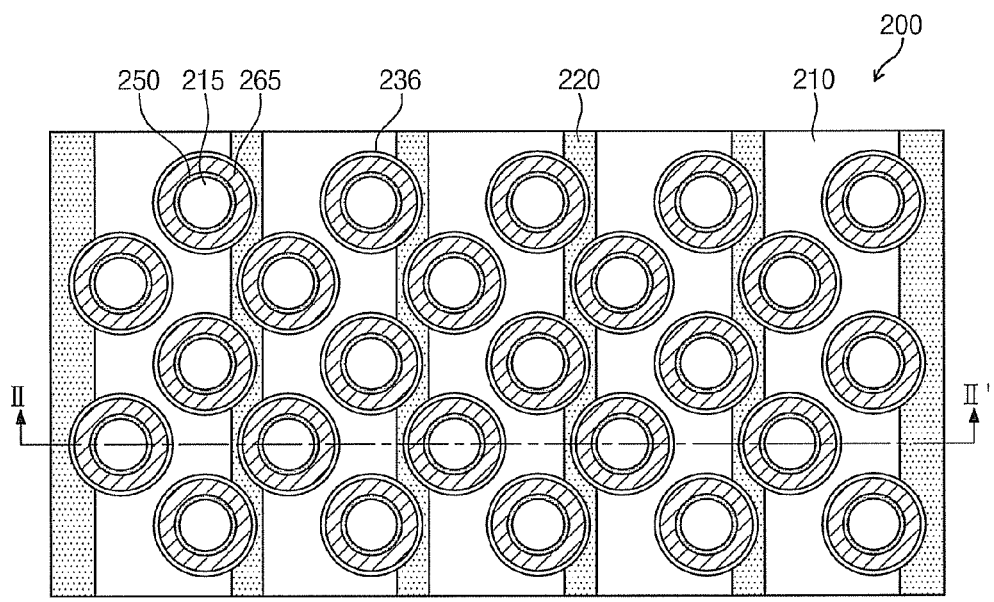
Figure 20B:
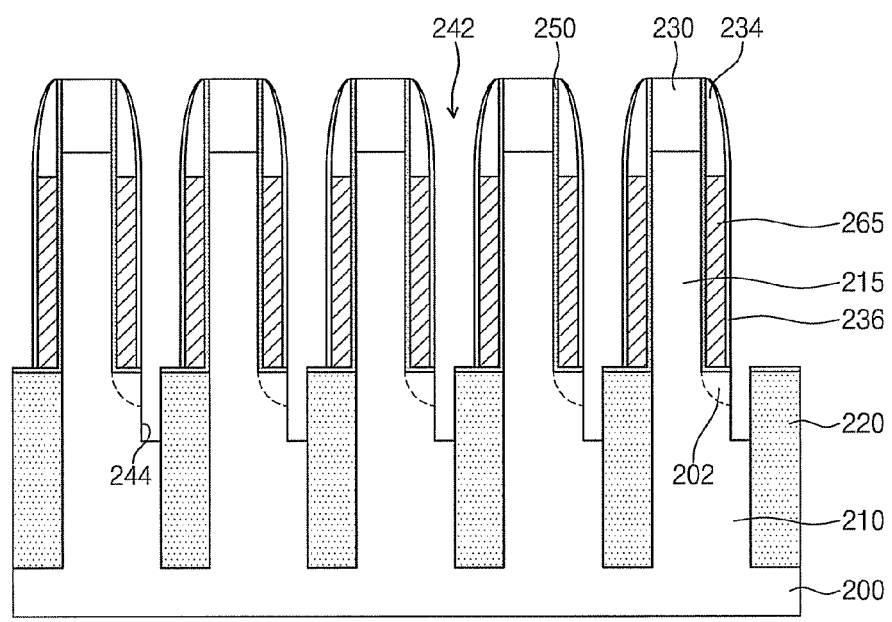

Referring to FIGS. 20A and 20B, an active layer 210 may be formed on a semiconductor substrate 200. The active layer 210 may be defined by device isolation layers 220, respectively. The active layer 210 may be patterned to form vertical channels 215 arranged in a zigzag pattern. A gate dielectric layer 250 and a gate electrode 265 may be formed to surround a sidewall of the vertical channels 215. By processes that are identical or similar to those described with reference to FIGS. 11B and 12B, the gate electrode 265 may be formed in a self-aligned manner by deposition and recession of a gate conductive layer and a dry etch using a gate spacer 234.

A passivation layer 236 may be formed on an inner sidewall of a gate isolation pattern 242. The passivation layer 236 may be formed in the form of liner by, for example, conformally depositing silicon oxide or silicon nitride. A buried bitline pattern 244 may be formed below the gate isolation pattern 242. The buried bitline pattern 244 may be formed by selectively dry-etching the active layer 210 constituting a bottom surface of the gate isolation pattern 242. The gate dielectric layer 250 exposed by the gate isolation pattern 242 may be removed during the dry etch for forming the buried bitline pattern 244. Alternatively, the buried bitline pattern 244 may be formed to have the same or a similar shape as the buried bitline pattern 144 shown in FIG. 13B by dry-etching the active layer 210 and the device isolation layer 220 without an etch selectivity.

Before forming the buried bitline pattern 244, a lower junction area 202 may be faulted by an ion implantation process. The lower junction area 202 may be lightly doped and heavily doped to be implemented as an LDD structure. In example embodiments, the buried bitline pattern 244 may be formed to be deeper than the lower junction area 202. Alternatively, the lower junction area 202 may be formed later in the process.

Figure 21A:
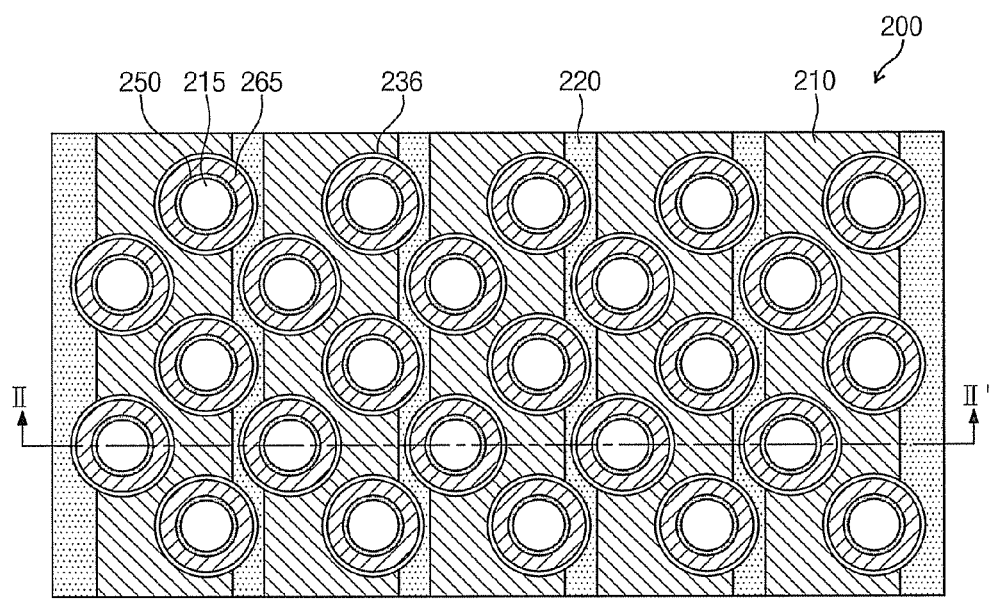
Figure 21B:
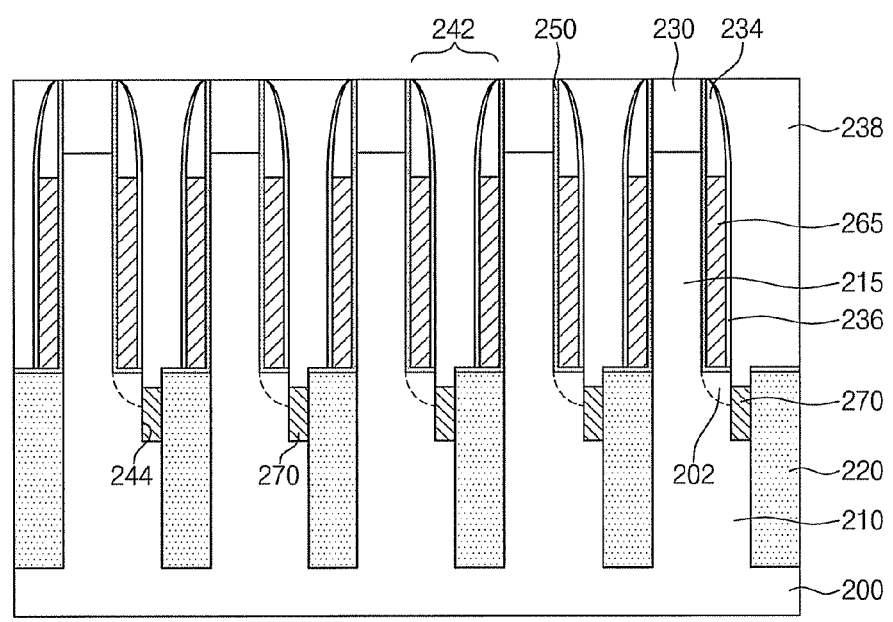

Referring to FIGS. 21A and 21B, a buried bitline 270 may be formed. The buried bitline 270 may be formed by selective epitaxial growth (SEG). According to the SEG, the buried bitline 270 may be formed to completely or partially fill the buried bitline pattern 244 and to have a curved shape bypassing the vertical channels 215 unlike the shape of the active layer 210. As another example, the buried bitline 270 may be formed by deposition and etch-back of a conductive material. For example, silicon doped with impurities may be deposited in the buried bitline pattern 244 and subjected to a silicidation reaction (e.g., $CoSi_x$) to form a silicided buried bitline 270. During the silicidation reaction, the impurities of the doped polysilicon may migrate to the active layer 210 to form the buried bitline 270 and a lower junction area 202 at the same time. As yet another example, the active layer 210 exposed by the buried bitline pattern 244 may be silicided to form the buried bitline 270 of metal (e.g., $CoSi_x$). According to example embodiments of the inventive concepts, the passivation layer 236 may prevent or reduce damage or impurity doping of the gate electrode 265 during an etch-back or silicidation process.

A gap-fill insulating layer 238 may be formed to fill the gate isolation pattern 242. The gap-fill insulating layer 238 may be formed by depositing a layer of silicon oxide, silicon nitride or a combination thereof and planarizing the deposited layer. When the buried bitline 270 does not fill the entirety of the buried bitline pattern 244, unfilled portions may be filled with the gap-fill insulating layer 238. As another example, an insulating layer which is identical or similar to the liner 137 in FIG. 14B may be further formed before forming the gap-fill insulating layer 238.

Figure 22A:
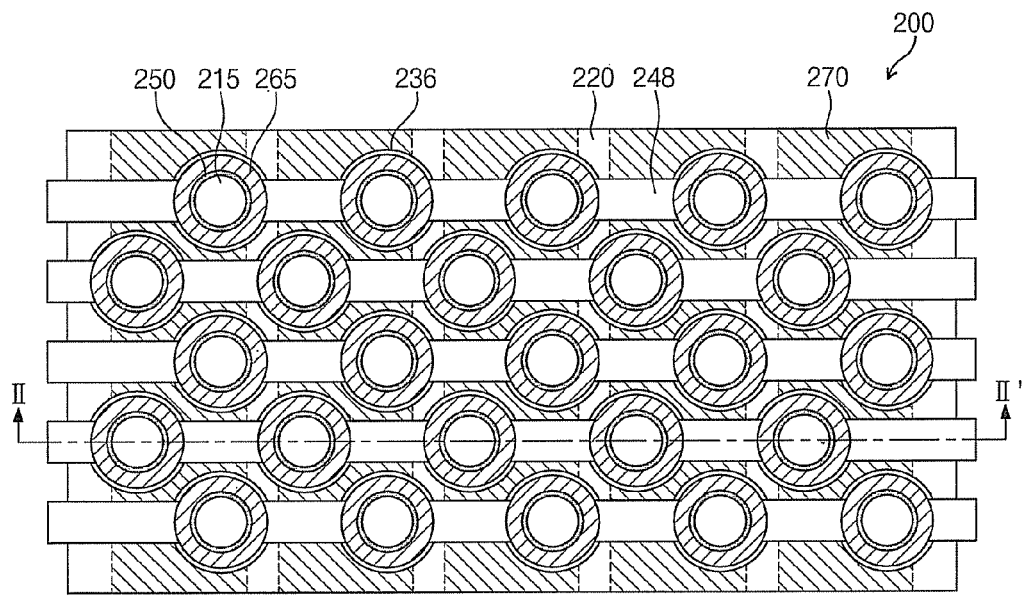
Figure 22B:
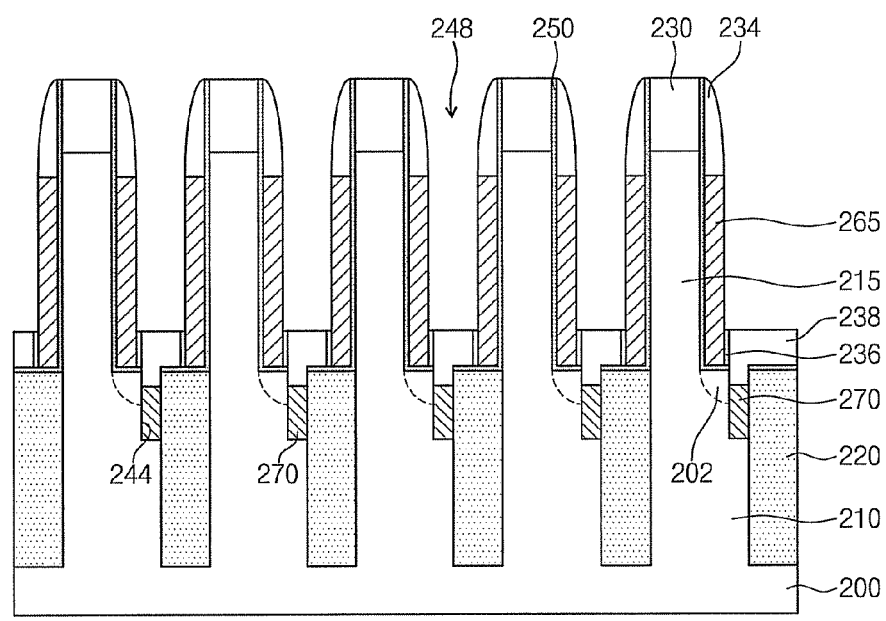

Referring to FIGS. 22A and 22B, a wordline contact pattern 248 may be formed to expose the sidewall of the gate electrode 265. The wordline contact pattern 248 may be formed by recessing the passivation layer 236 and the gap-fill insulating layer 238 using a dry etch process. The wordline contact pattern 248 may be formed in the form of a line discontinuously extending along the line II-II'.

Figure 23A:
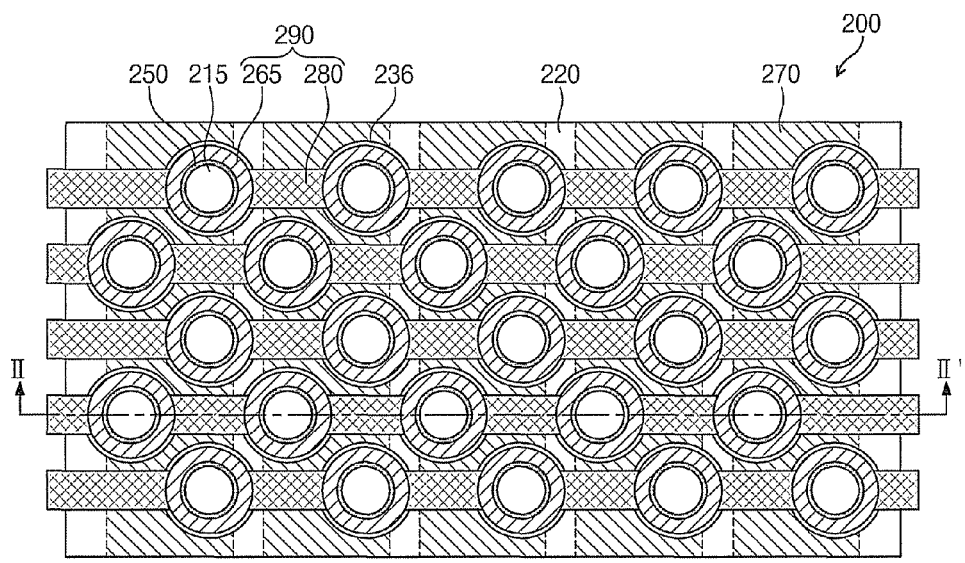
Figure 23B:
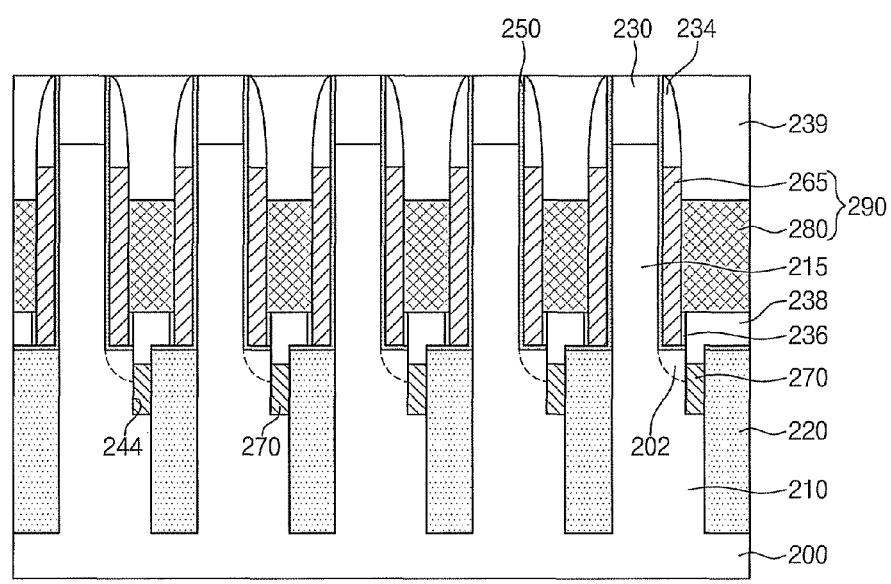

Referring to FIGS. 23A and 23B, the wordline contact pattern 248 may be filled with a conductive material to form a wordline plug-in 280 connected to the gate electrode 265 and a capping insulating layer 239 covering the wordline plug-in 280. Thus, two gate electrodes 265 (a right one and a left one) may be interconnected by the wordline plug-in 280 formed therebetween to implement a wordline 290.

Figure 24A:
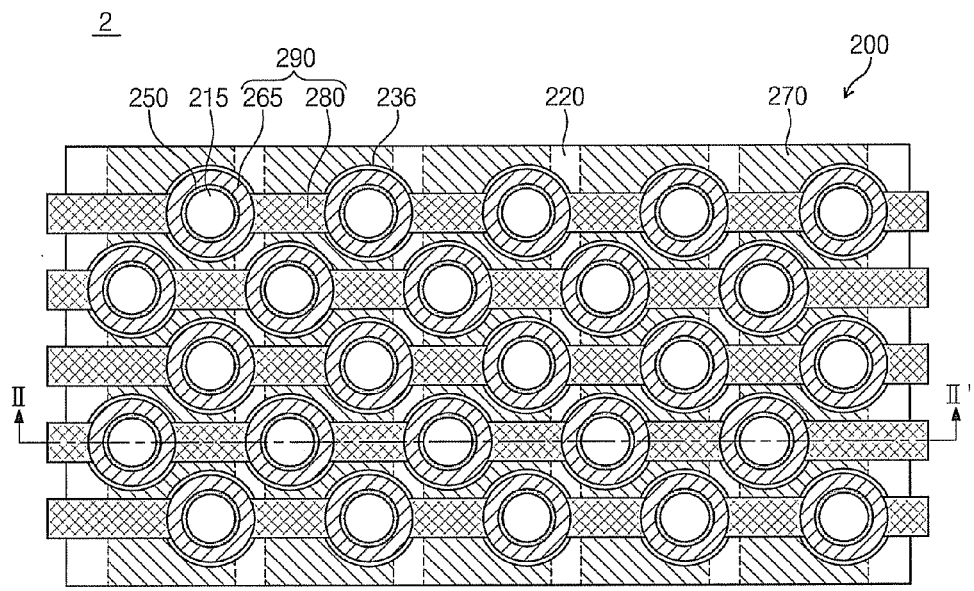
Figure 24B:
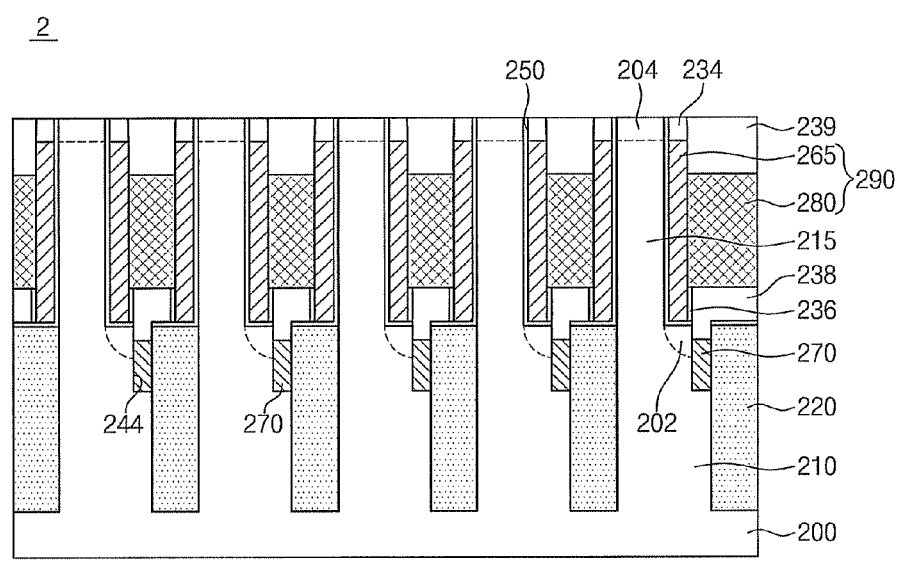

Referring to FIGS. 24A and 24B, a hard mask 230 may be removed and then an upper junction area 204 may be formed at an upper end of the vertical channels 215. Thus, a vertical channel transistor 2 shown in FIG. 3 may be implemented which includes vertical channels 215 arranged in a zigzag pattern, line-shaped wordlines 290 where gate electrodes 265 formed in a self-aligned manner to surround the vertical channels 215 are interconnected by the wordline plug-in 280, and curved buried bitlines 270 extending along the edge of the active layer 210.

FIGS. 25A to 27A are top plan views illustrating a method for fabricating a vertical channel transistor according to example embodiments of the inventive concepts, and FIGS. 25B to 27B are cross-sectional views taken along the line III-III' in FIGS. 25A to 27A, respectively.

Figure 25A:
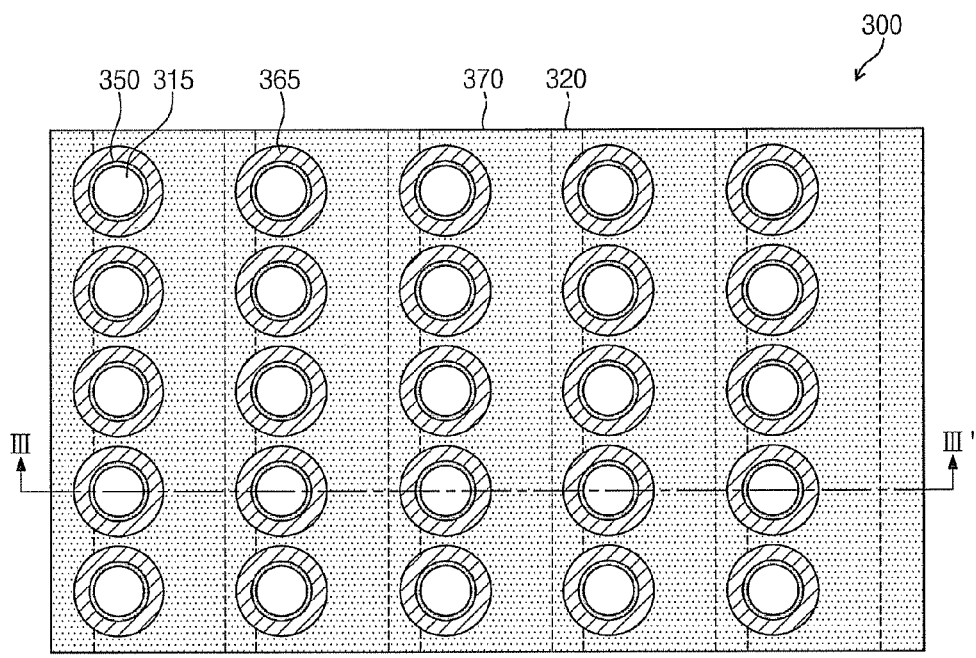
Figure 25B:
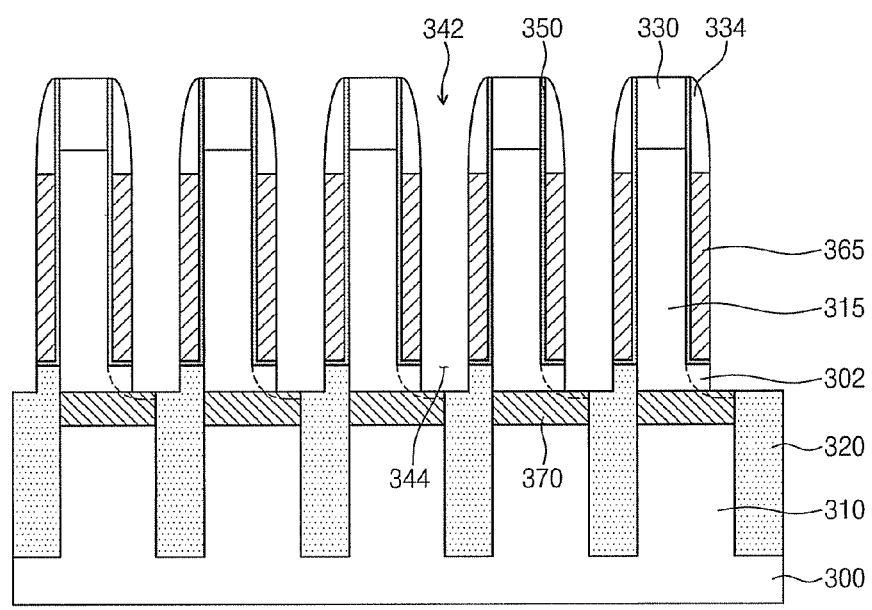

Referring to FIGS. 25A and 25B, an active layer 310 may be formed on a semiconductor substrate 300. The active layer 310 may be defined by device isolation layers 320, respectively. The active layer 310 may be patterned to form vertical channels 315 that are linearly arranged lengthwise of the active layer 310. The vertical channels 315 may be formed to be adjacent to one sidewall of the active layer 310. A gate dielectric layer 350 may be formed to surround a sidewall of the vertical channels 315, and a gate electrode 365 may be formed in a self-aligned manner by deposition and recession of a gate conductive layer and a dry etch using a gate spacer 334. Gate electrodes 365 may be isolated from each other by a gate isolation pattern 342.

The active layer 310 constituting a bottom surface of the gate isolation pattern 342 may be dry etched without an etch selectivity with respect to the device isolation layer 320 to form a buried bitline pattern 344. Alternatively, the buried bitline pattern 344 may be formed by selectively dry-etching the active layer 310 to have the identical or similar shape to the bitline pattern 244. Before forming the buried bitline pattern 344, a lower junction area 302 may be formed by an ion implantation process.

A buried bitline 370 may be formed by implanting impurities into the active layer 310 exposed by the buried bitline pattern 344 or siliciding the exposed active layer 310. According to example embodiments of the inventive concepts, the buried bitline 370 may be formed to extend lengthwise of the active layer 310 and have a width that is equal to or less than width of the active layer 310.

Figure 26A:
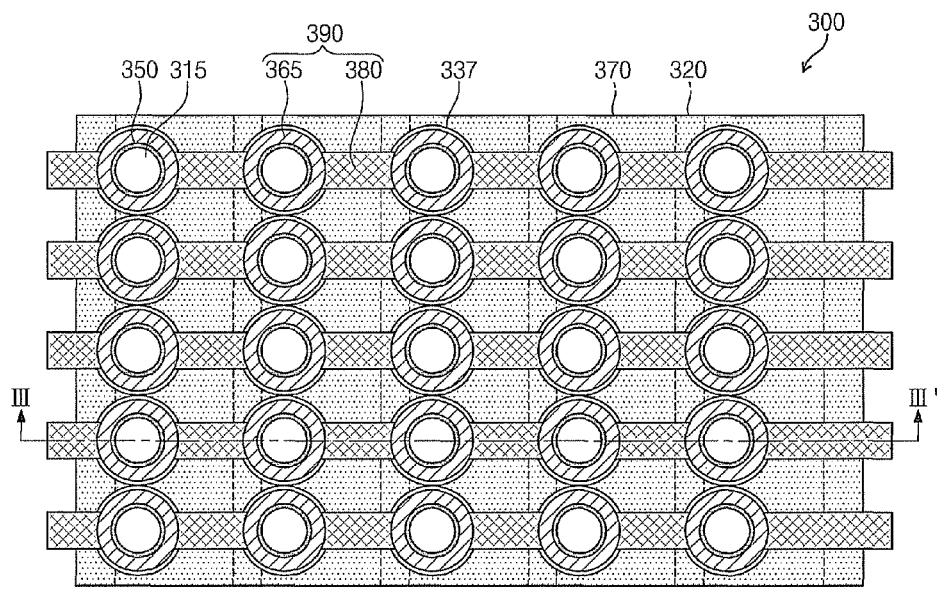
Figure 26B:
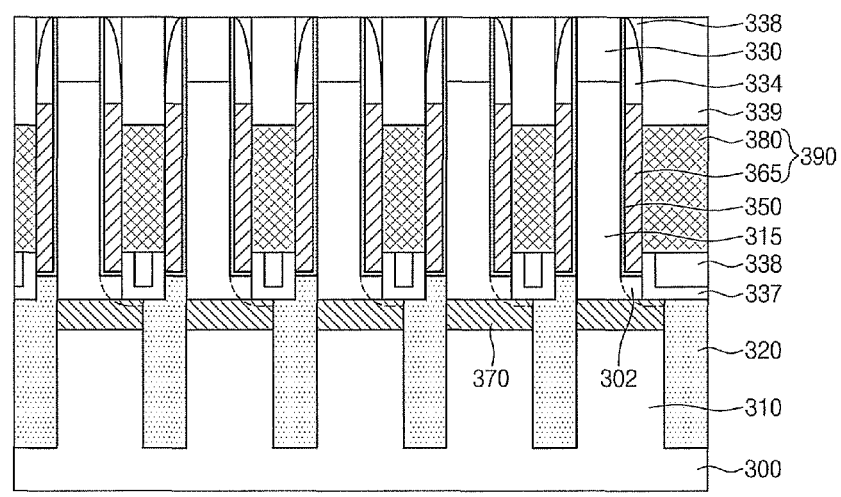

Referring to FIGS. 26A and 26B, a wordline plug-in 380 may be formed to connect gate electrodes 365. The wordline plug-in 380 may be formed by depositing and recessing a liner 337 and a gap-fill insulating layer 338, and depositing and etching a conductive material. The wordline plug-in 380 may connect gate electrodes 365 formed at opposite sides of the wordline plug-in 380 to implement a wordline 390. A capping insulating layer 339 may be formed to cover the wordline plug-in 380.

Figure 27A:
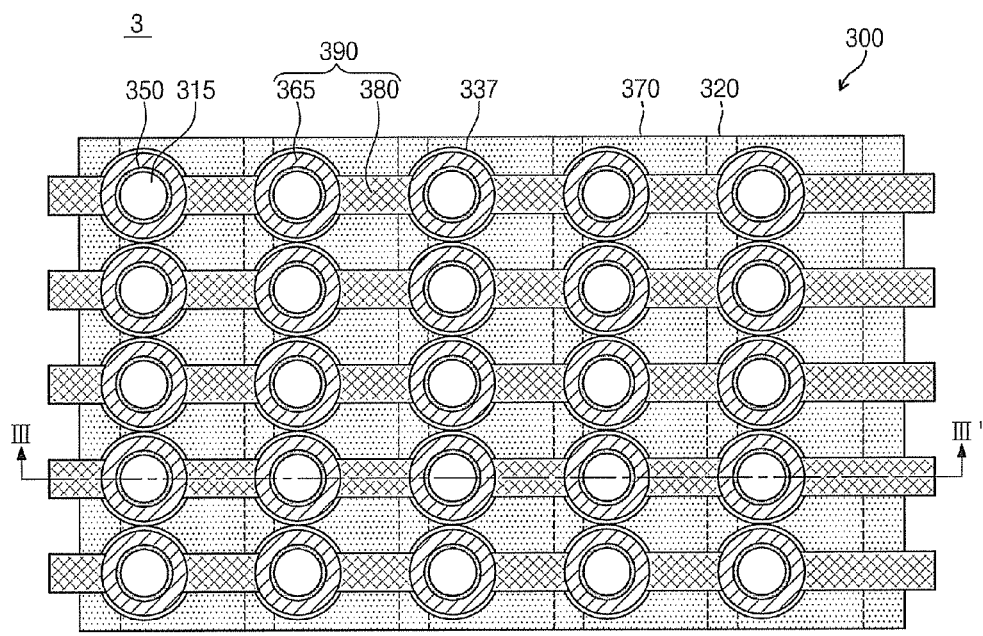
Figure 27B:
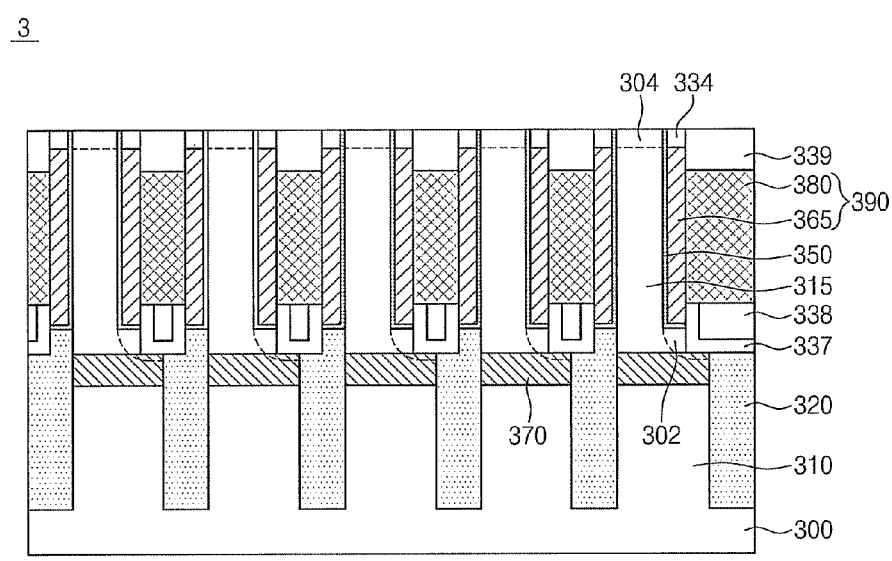

Referring to FIGS. 27A and 27B, a hard mask 330 may be removed by a planarization process and impurities may be implanted into an upper end of the vertical channels 315 to form an upper junction area 304. Thus, a vertical channel transistor 3 shown in FIG. 4 may be implemented which includes vertical channels 315 arranged linearly, line-shaped wordlines 390 where gate electrodes 365 formed in a self-aligned manner to surround the vertical channels 315 are interconnected by the wordline plug-in 380, and buried bitlines 370 extending along the active layer 310.

FIGS. 28A to 30A are top plan views illustrating a method for fabricating a vertical channel transistor according to example embodiments of the inventive concepts, and FIGS. 28B to 30B are cross-sectional views taken along the line IV-IV' in FIGS. 28A to 30A, respectively. In order to avoid duplicate explanations, the following explanations relate only to aspects that are different from FIGS. 8A/B to 17A/B.

Figure 28A:
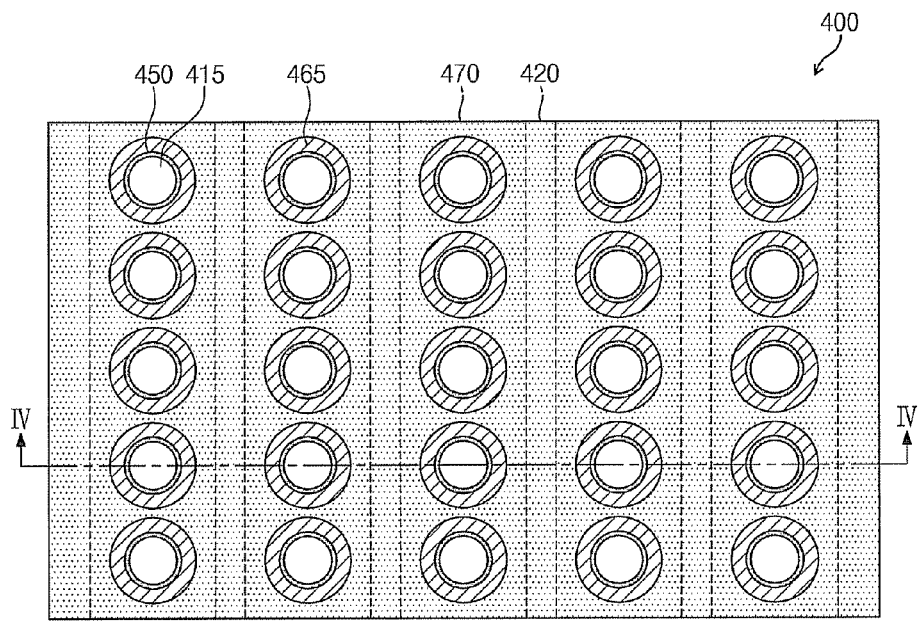
Figure 28B:
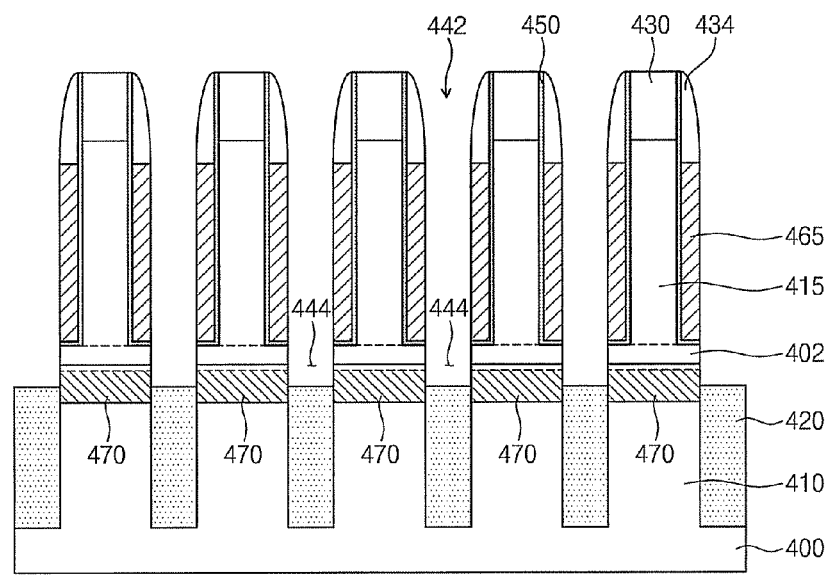

Referring to FIGS. 28A and 28B, vertical channels 415 may be formed on a semiconductor substrate 400 along an active layer 410. The vertical channels 415 may occupy the center of the active layer 410. A gate dielectric layer 450 and a gate electrode 465 may be formed to surround the sidewall of the vertical channels 415. The gate electrode 465 may be formed in a self-aligned manner by dry etch using a gate spacer 434. Gates electrodes 465 may be isolated by a gate isolation pattern 442. Impurities may be implanted into the active layer 410 constituting a bottom surface of the gate isolation pattern 442 to form a lower junction area 402.

A buried bitline pattern 444 may be formed below the gate isolation pattern 442, and a buried bitline 470 may be formed at the active layer 410 exposed by the buried bitline pattern 444 by an ion implantation process or a silicidation process. The buried bitline pattern 444 may be formed by dry-etching the active layer 410 and a device isolation layer 420 without an etch selectivity or selectively dry-etching the active layer 410. According to example embodiments of the inventive concepts, the buried bitline 470 may be formed to extend along the active layer 410 below the vertical channels 415.

Figure 29A:
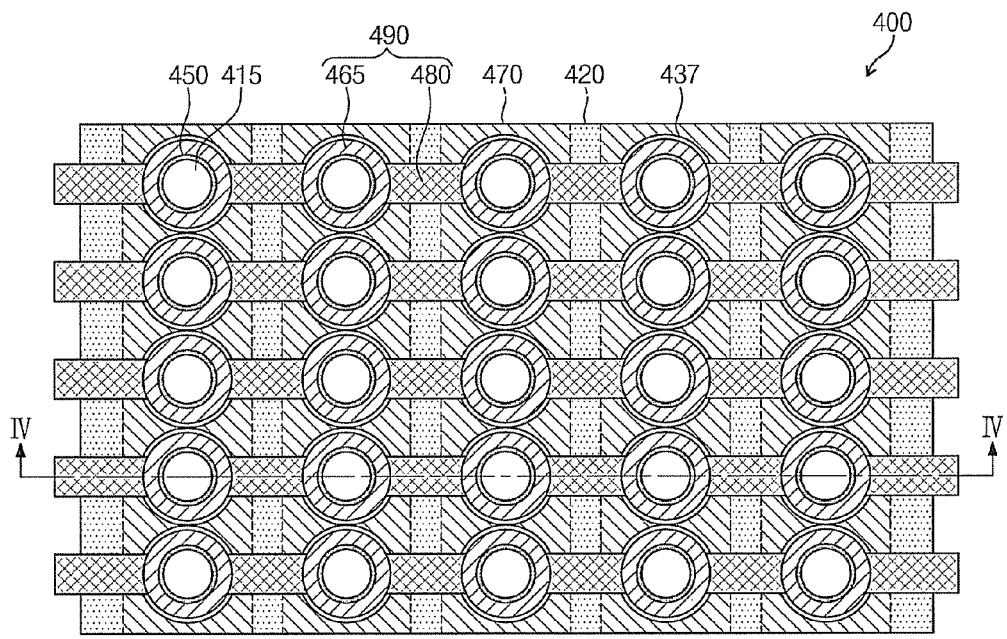
Figure 29B:
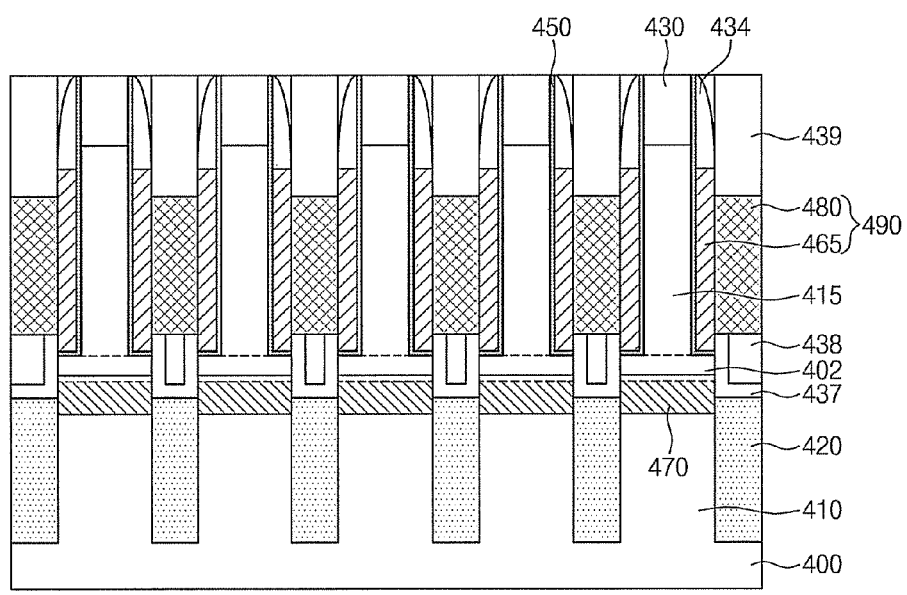

Referring to FIGS. 29A and 29B, a lower portion of the gate isolation pattern 442 may be filled with a liner 437 and a gap-fill insulating layer 438, and a wordline contact 480 may be disposed thereon to connect the gate electrodes 465. Thus, a wordline 490 may be formed. The wordline contact 480 may be capped with the capping insulating layer 439.

Figure 30A:
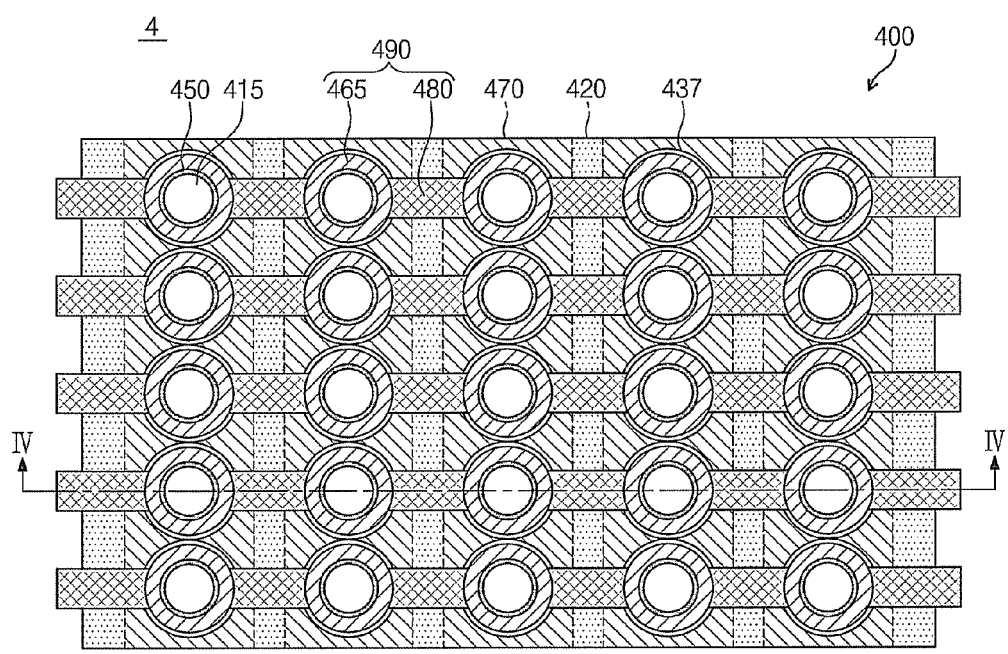
Figure 30B:
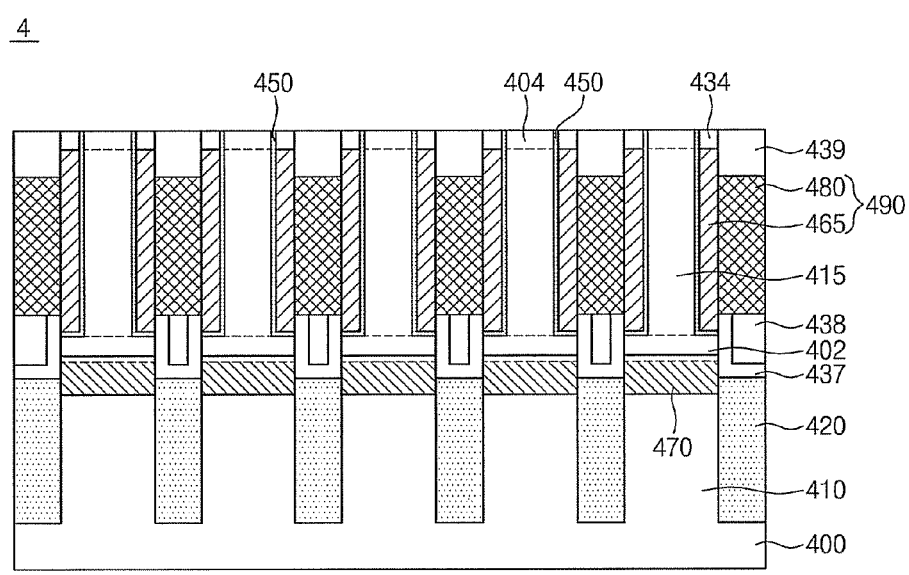

Referring to FIGS. 30A and 30B, removal of the hard mask 430 and formation of an upper junction area 404 may be done to implement a vertical channel transistor 4 shown in FIG. 4 which includes vertical channels 415 arranged linearly, line-shaped wordlines 490 where gate electrodes 465 formed in a self-aligned manner to surround the vertical channels 415 are interconnected by wordline contacts 480, and buried bitlines 470 extending along the active layer 410.

FIGS. 31A to 36A are top plan views illustrating a method for fabricating a vertical channel transistor according to example embodiments of the inventive concepts, and FIGS. 31B to 36B are cross-sectional views taken along the line V-V' in FIGS. 31A to 36A, respectively.

Figure 31A:
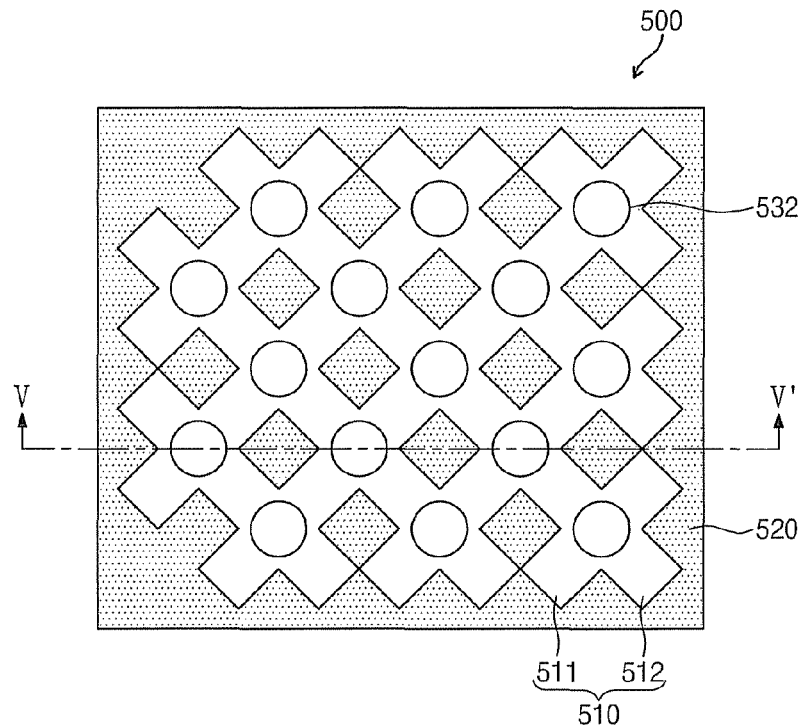
Figure 31B:
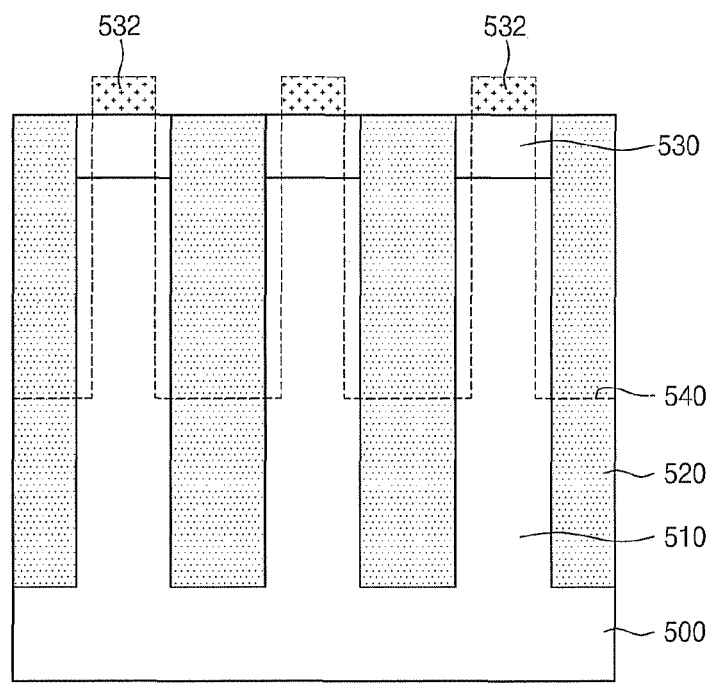

Referring to FIGS. 31A and 31B, an active layer 510 may be formed on a semiconductor substrate 500. The active layer 510 may be defined by a device isolation layer 520. The active layer 510 may be formed to have a honeycomb pattern formed by perpendicularly crossing a plurality of oblique lines. As an example, a honeycomb-pattern active layer 510 may be implemented by sequentially forming a plurality of first active layers 511 extending from a left lower portion to a right upper portion and a plurality of second active layers 512 extending a right lower portion to a left upper portion. As another example, the honeycomb-pattern active layer 510 may be implemented by simultaneously forming the first active layer 511 and the second active layer 512 through a dry etch using a honeycomb-pattern hard mask 530 to remove a portion of the semiconductor substrate 500.

A photoresist mask 532 may be formed to define a damascene pattern 540. The damascene pattern 540 may be formed by removing a portion of the active layer 510 and the device isolation layer 520. The photoresist mask 532 may be formed on the active layer 510. As an example, photoresist masks 532 may be formed at intersections of the first and second active layers 511 and 512 to be arranged in a zigzag pattern on the semiconductor substrate 500.

Figure 32A:
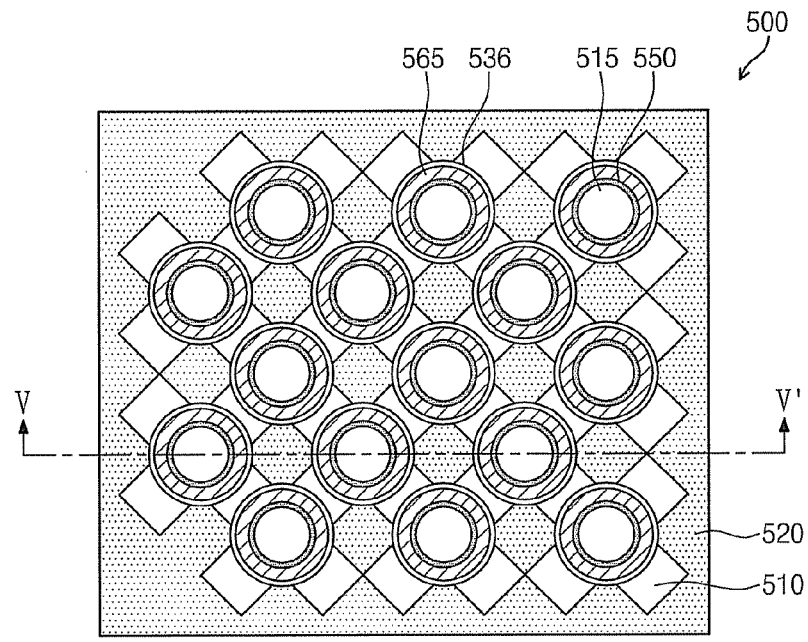
Figure 32B:
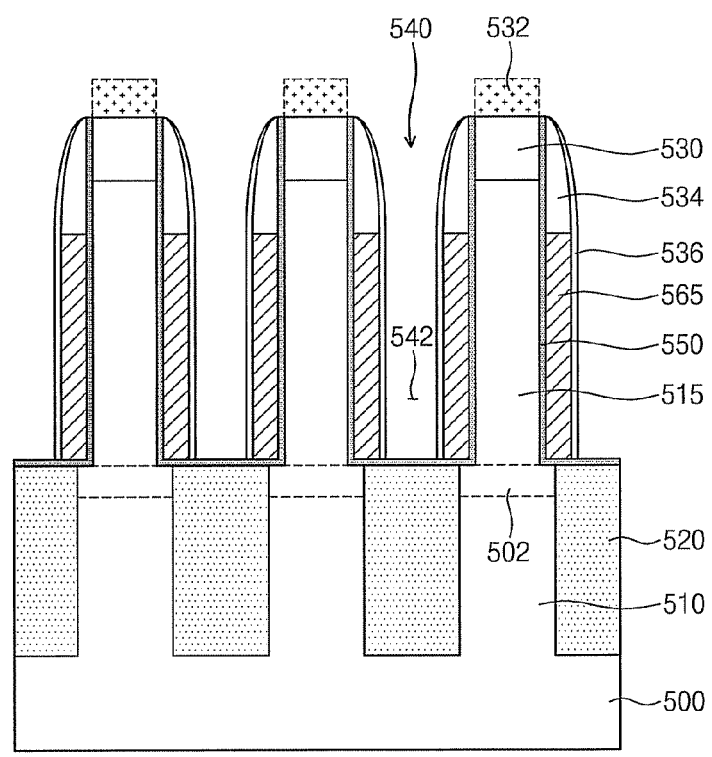

Referring to FIGS. 32A and 32B, vertical channels 515 may be formed to be arranged in a zigzag pattern on the semiconductor substrate 500. A portion of the active layer 510 and the device isolation layer 520 may be removed by, for example, a dry etch using the photoresist mask 532 to form the damascene pattern 540. The formation of the damascene pattern 540 may define a plurality of vertical channels 515 which are configured as a portion of the active layer 510 and vertically protrude on the semiconductor substrate 500. The photoresist mask 532 may be removed by an ashing process.

A gate dielectric layer 515 and a gate electrode 565 may be formed to surround the sidewalls of the vertical channels 515. As previously described with reference to FIGS. 10B to 12B, the gate electrodes 565 may be formed in a self-aligned manner by a gate isolation pattern 542 through a gate isolation etch.

Impurities may be implanted into the active layer 510 between the vertical channels 515 to form a lower junction area 502. Before forming the lower junction area 502, a passivation layer 536 may be formed by depositing an insulator on the sidewall of the gate electrode 565. The passivation layer 536 may prevent or reduce impurities from being implanted into the gate electrode 565 during an impurity doping process.

Figure 33A:
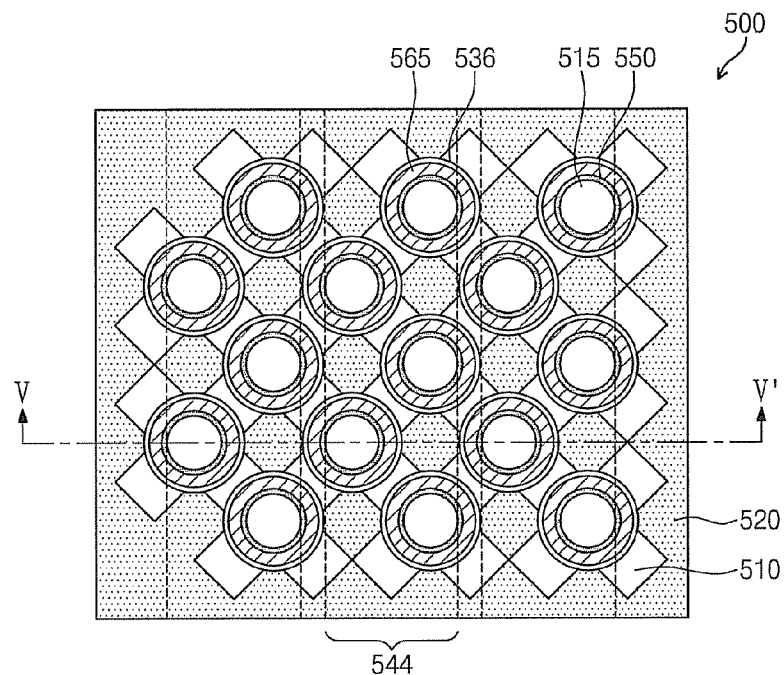
Figure 33B:
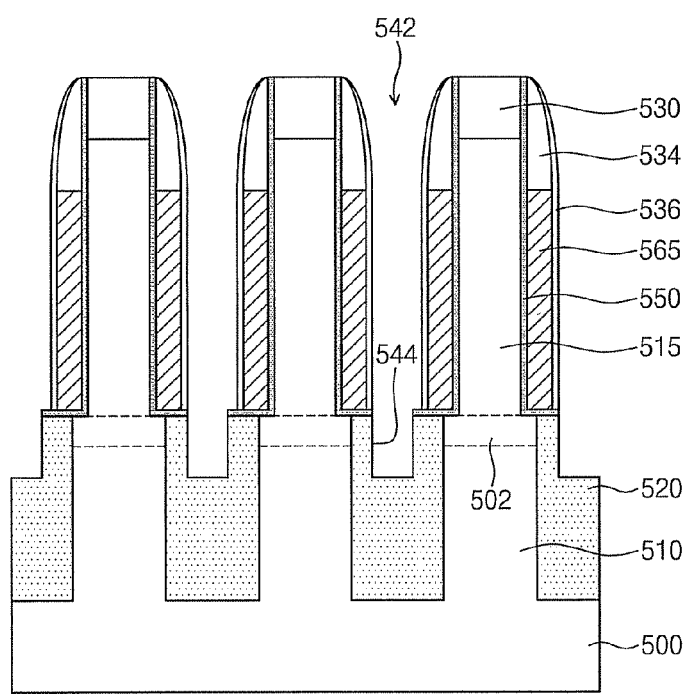

Referring to FIGS. 33A and 33B, a buried bitline pattern 544 may be formed to extend in one direction on the semiconductor substrate 500. The buried bitline pattern 544 may be formed by recessing the active layer 510 and the device isolation layer 520 through a dry etch for the active layer 510 and the device isolation layer 520 without an etch selectivity. The passivation layer 536 may prevent or reduce etch damage of the gate electrode 565 which may occur during the dry etch. In one buried bitline pattern 544, vertical channels 515 arranged in a zigzag pattern lengthwise of the buried bitline pattern 544 may be included.

Figure 34A:
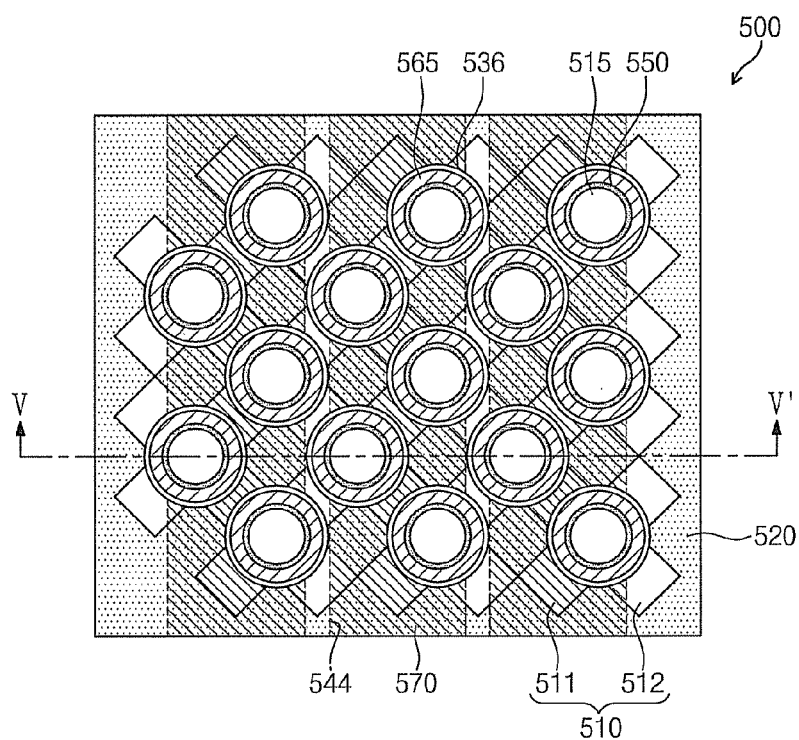
Figure 34B:
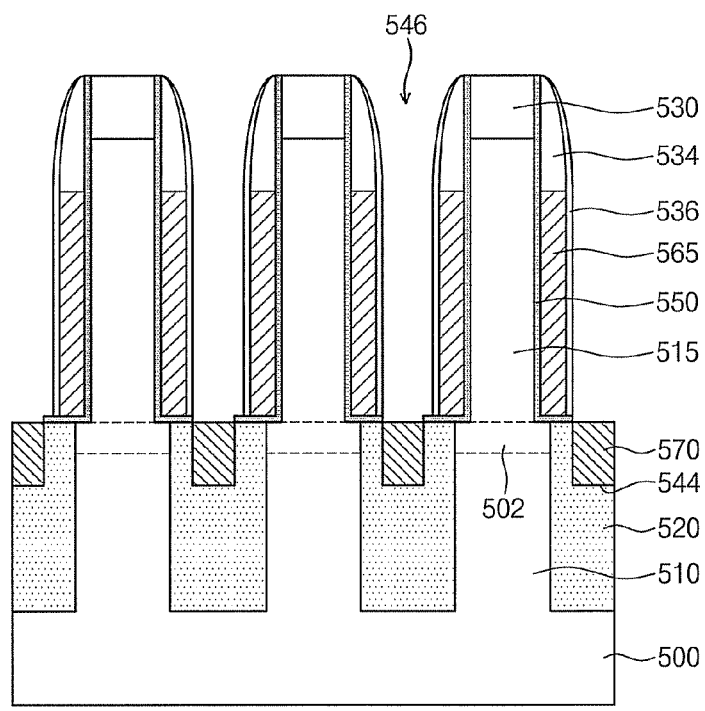

Referring to FIGS. 34A and 34B, a buried bitline 570 may be formed in the buried bitline pattern 544. As an example, the buried bitline 570 may be formed in a gap 546 between the vertical channels 515 by deposition and etch of a conductive material to fill the buried bitline pattern 544. As another example, a silicided buried bitline 570 may be formed by depositing impurity-doped polysilicon in the buried bitline pattern 544 and siliciding the deposited polysilicon. When the deposited polysilicon is silicided, the impurities of the doped polysilicon may migrate to the active layer 510 to form the buried bitline 570 and a lower junction area 502 at the same time. According to example embodiments of the inventive concepts, the buried bitline 570 may be formed to linearly extend below the vertical channels 515 arranged in a zigzag pattern and may be formed in the form of line that obliquely intersects the first active layer 511 or the second active layer 512.

Figure 35A:
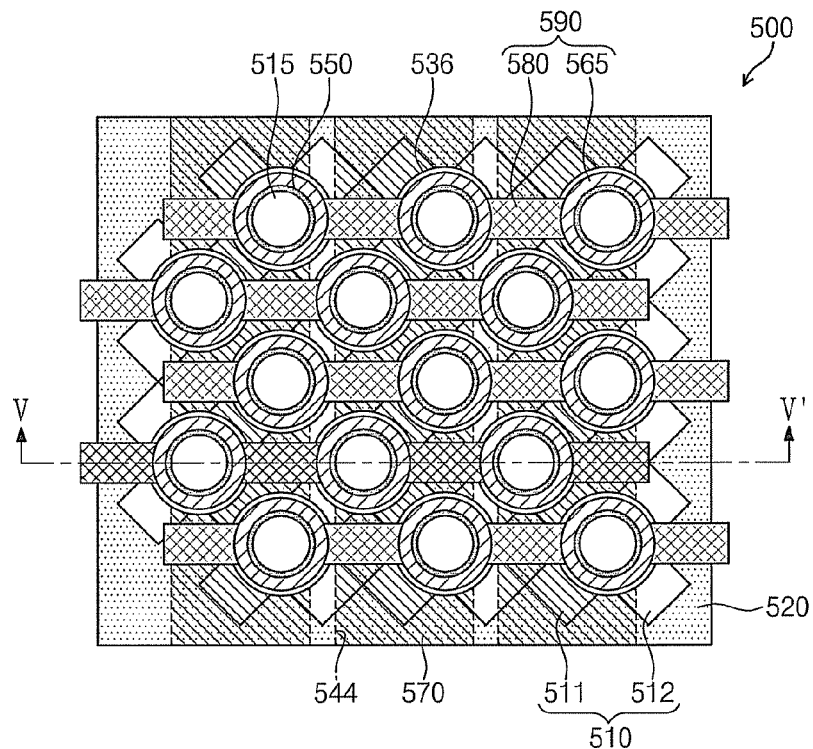
Figure 35B:
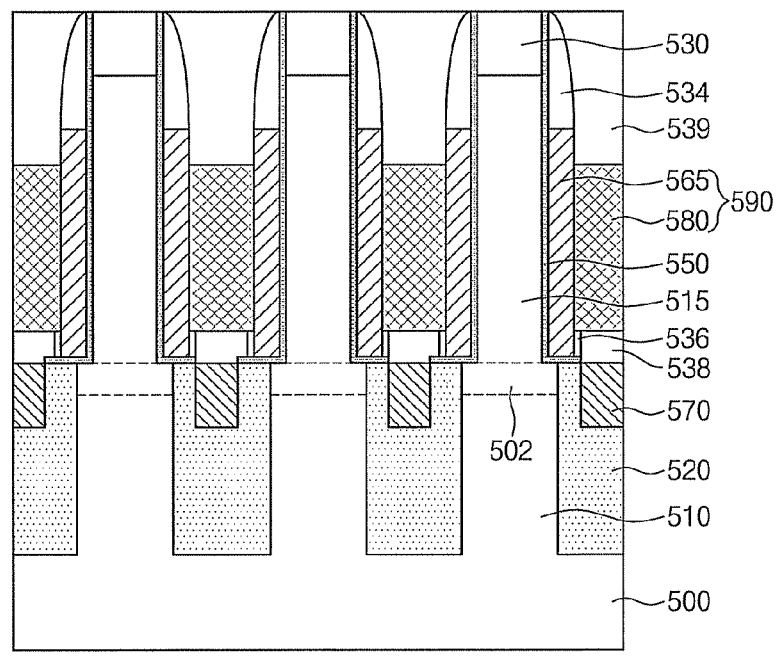

Referring to FIGS. 35A and 35B, a wordline plug-in 580 may be formed by deposition and recession of a gap-fill insulating layer 538 and deposition, and etch-back of a conductive material to connect the gate electrodes 565. Thus, a wordline 590 may be implemented. A capping insulating layer 539 may be formed to cover the wordline plug-in 580. The wordline 590 may be formed in the form of line that obliquely intersects the first active layer 511 or the second active layer 512.

Figure 36A:
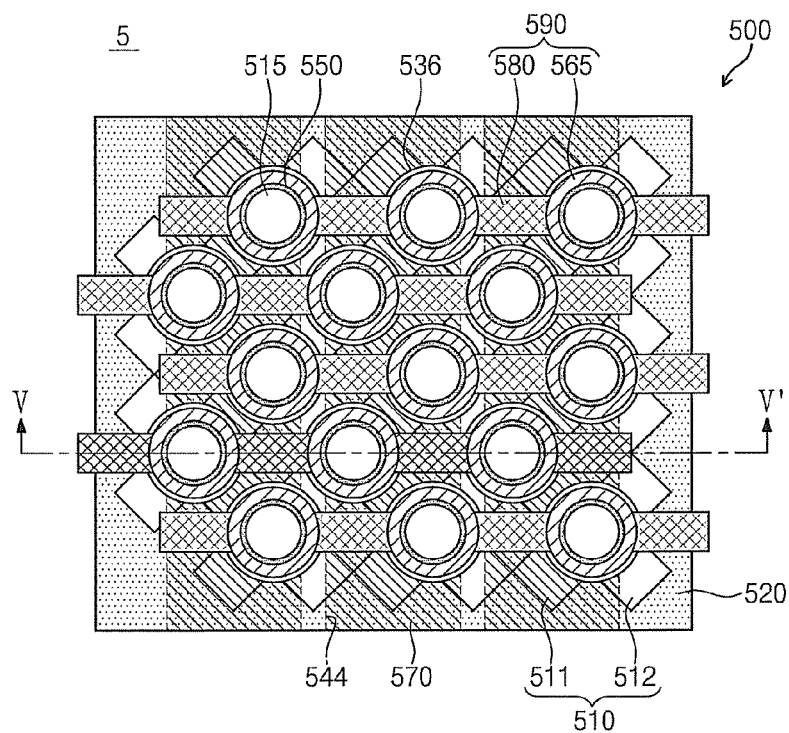
Figure 36B:
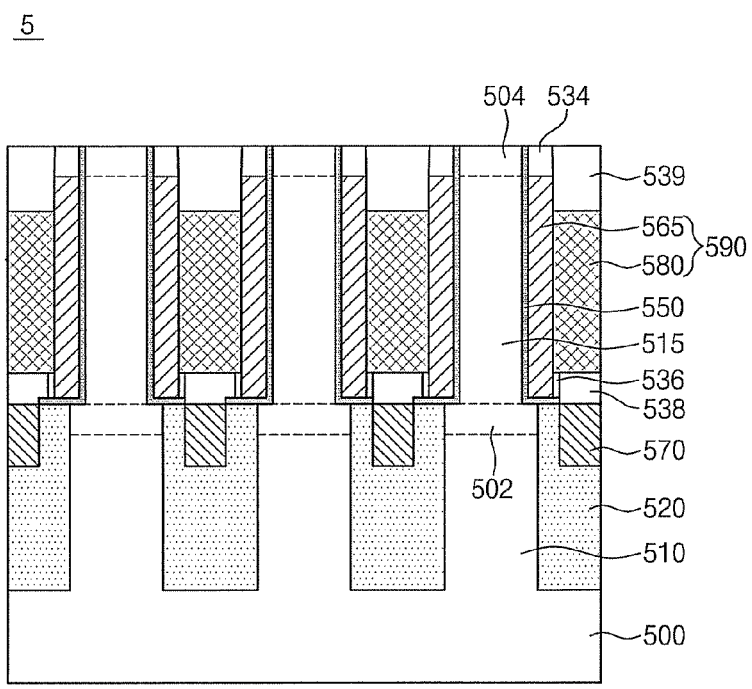

Referring to FIGS. 36A and 36B, a hard mask 530 may be removed by a planarization process and impurities may be implanted into an upper end of the vertical channels 515 to form an upper junction area 504. Thus, a vertical channel transistor 5 shown in FIG. 6 may be implemented which includes vertical channels 515 arranged in a zigzag pattern on the honeycomb-pattern active layer 510, line-shaped wordlines 590 where gate electrodes 565 formed in a self-aligned manner to surround the vertical channels 515 are interconnected by wordline plug-in 580, and line-shaped buried bitlines 570 extending to obliquely intersect the active layer 510.

FIGS. 37A to 40A are top plan views illustrating a method for fabricating a vertical channel transistor according to example embodiments of the inventive concepts, and FIGS. 37B to 40B are cross-sectional views taken along the line VI-VI' in FIGS. 37A to 40A, respectively.

Figure 37A:
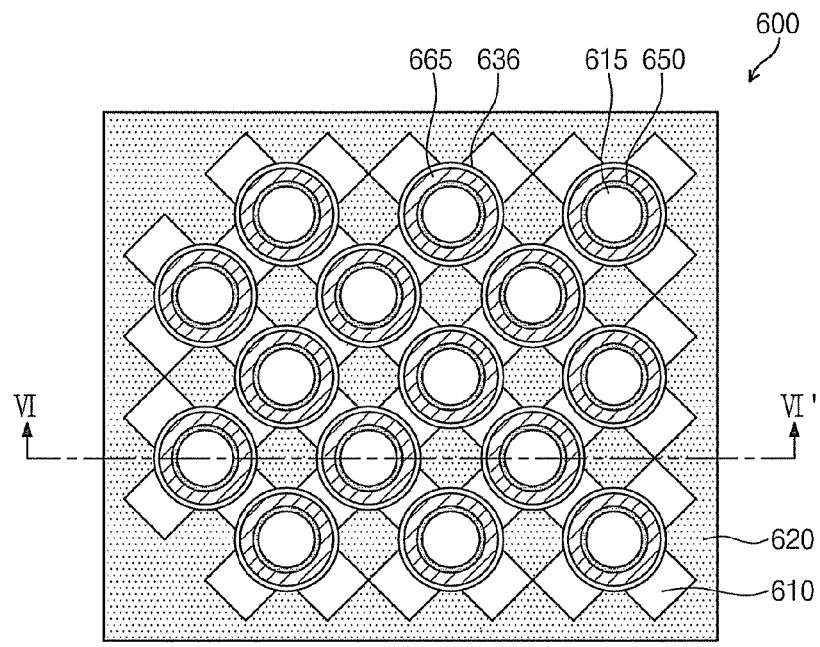
Figure 37B:
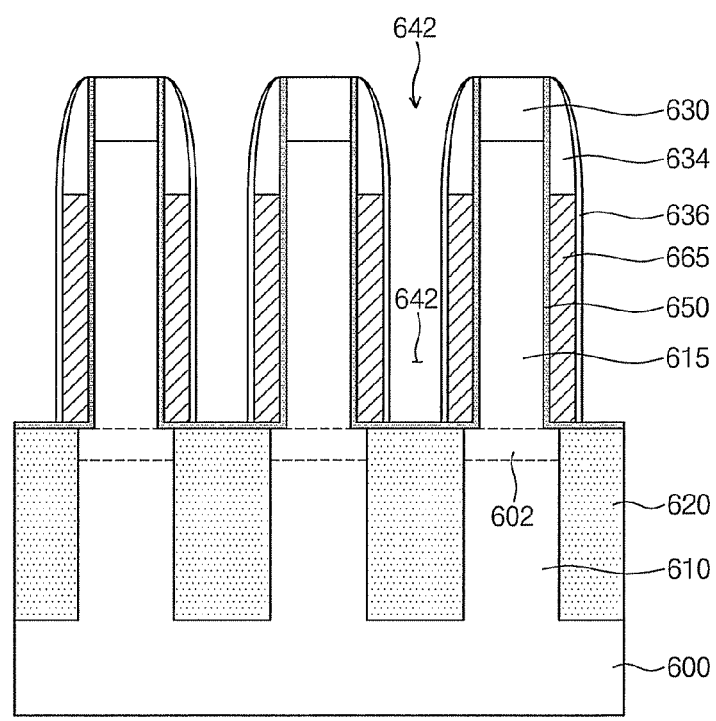

Referring to FIGS. 37A and 37B, an active layer 610 may be formed on a semiconductor substrate 600. The active layer 610 may be defined by a device isolation layer 620. The active layer 610 and the device isolation layer 620 may be partially removed to form a plurality of vertical channels 615. A gate dielectric layer 650 may be formed to surround the vertical channels 615. The active layer 610 may be formed to have a honeycomb pattern by a dry etch using a hard mask 630, and the vertical channels 615 may be arranged in a zigzag pattern on the active layer 610. A gate electrode 665 may be formed in a self-aligned manner by forming a gate isolation pattern 642 through a dry etch using a gate spacer 634. After forming a passivation layer 636 to surround the gate electrode 665, impurities may be implanted into the active layer 610 to form a lower junction area 602.

Figure 38A:
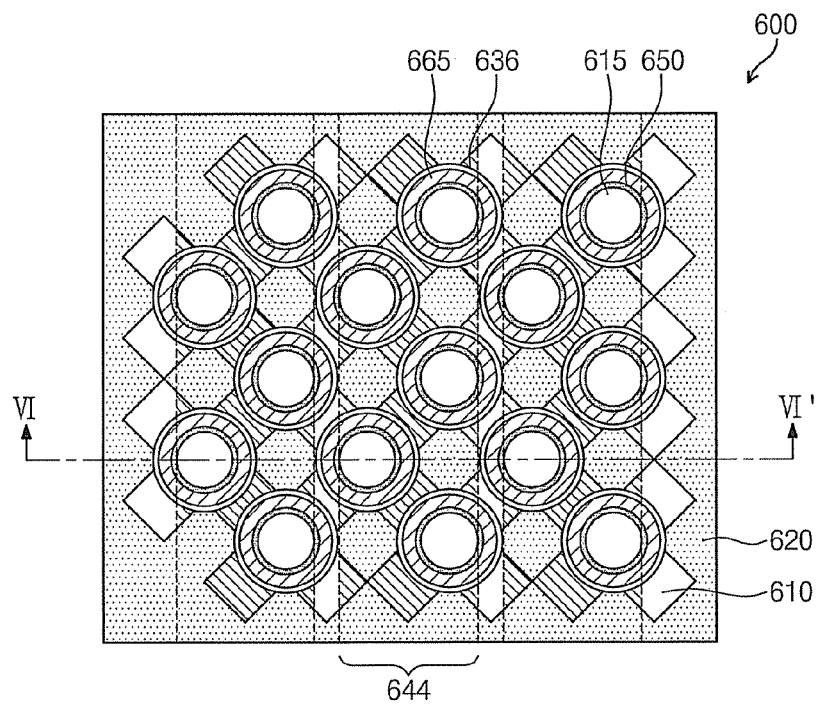
Figure 38B:
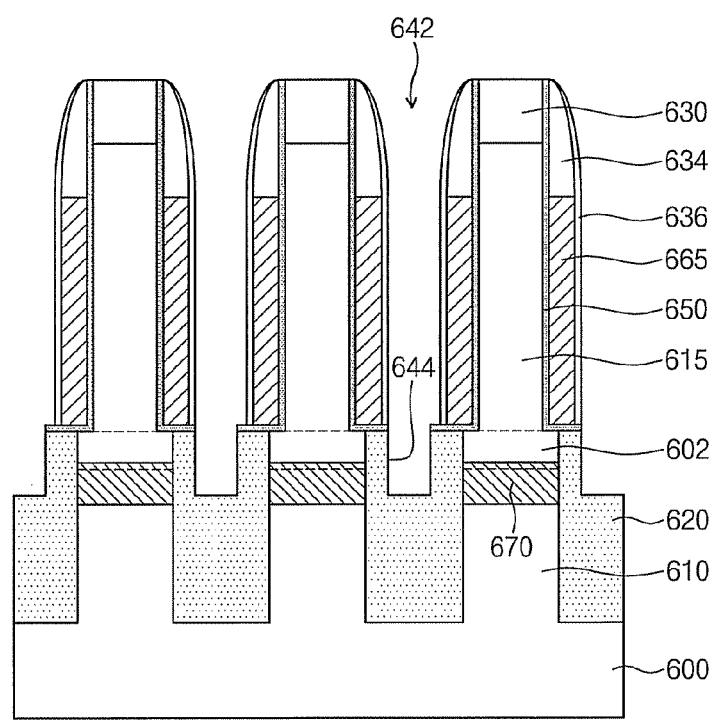

Referring to FIGS. 38A and 38B, the active layer 610 and the device isolation layer 620 may dry-etched without an etch selectivity to be recessed. According to the recession of the active layer 610 and the device isolation layer 620, a buried bitline pattern 644 may be formed to provide a region where the vertical channels 615 are arranged in a zigzag pattern. The active layer 610 exposed by the buried bitline pattern 644 may be doped with impurities or silicided to form a buried bitline 670. According to example embodiments of the inventive concepts, unlike FIGS. 34A and 34B, the buried bitline 670 may be formed to be limited within the active layer 610 and extend on the semiconductor substrate 600 in one direction while being arranged in a zigzag pattern like the vertical channels 615.

Figure 39A:
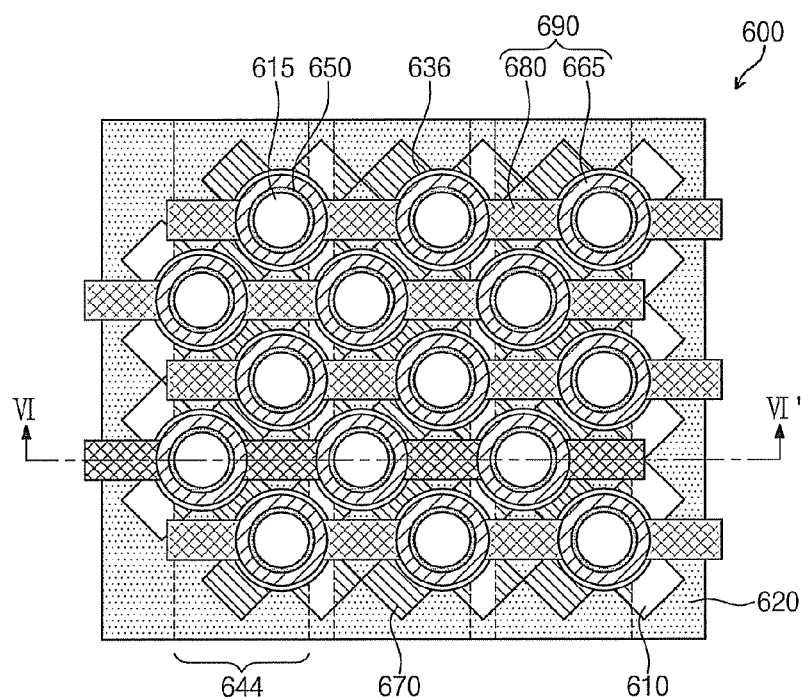
Figure 39B:
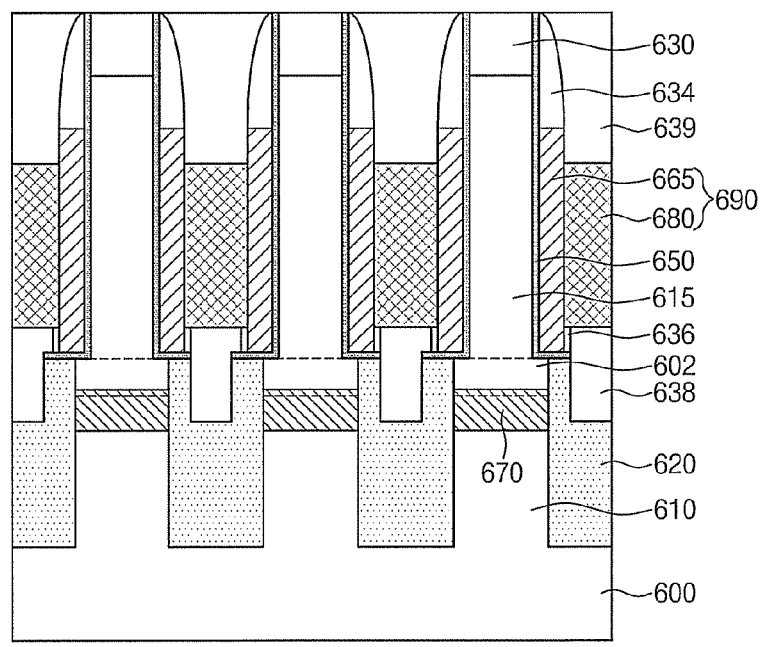

Referring to FIGS. 39A and 39B, a wordline plug-in 680 may be formed by deposition and recession of a gap-fill insulating layer 638, and deposition and etch-back of a conductive material to connect the gate electrodes 665. Thus, a wordline 690 may be implemented. A capping insulating layer 639 may be formed to cover the wordline plug-in 680. According to example embodiments of the inventive concepts, because the buried bitline 670 may be formed by doping or siliciding the active layer 610 exposed by the buried bitline pattern 644, the buried bitline pattern 644 may not be completely filled with the buried bitline 670. Accordingly, an unfilled region of the buried bitline pattern 644 may be filled with the gap-fill insulating layer 638.

Figure 40A:
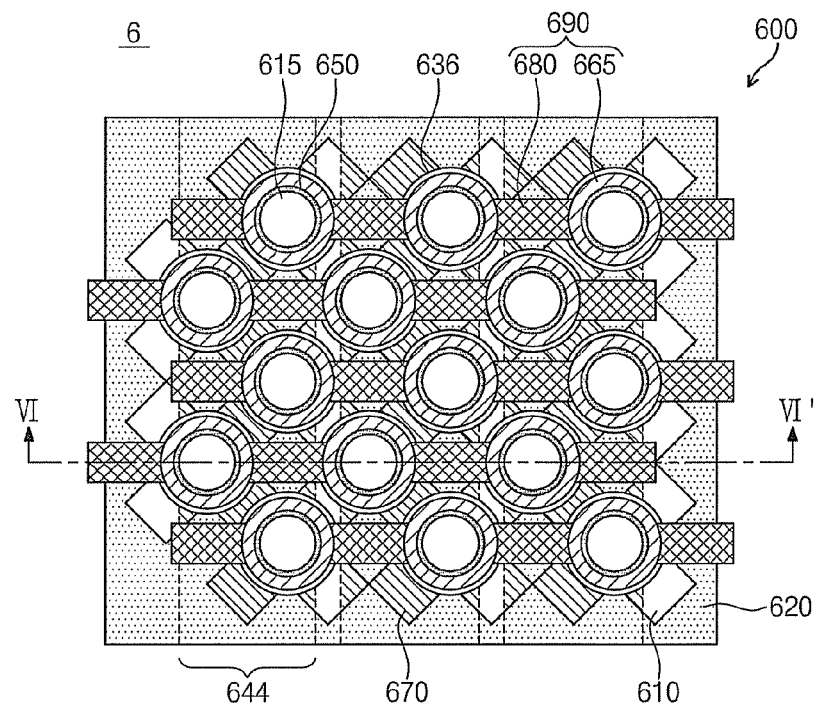
Figure 40B:
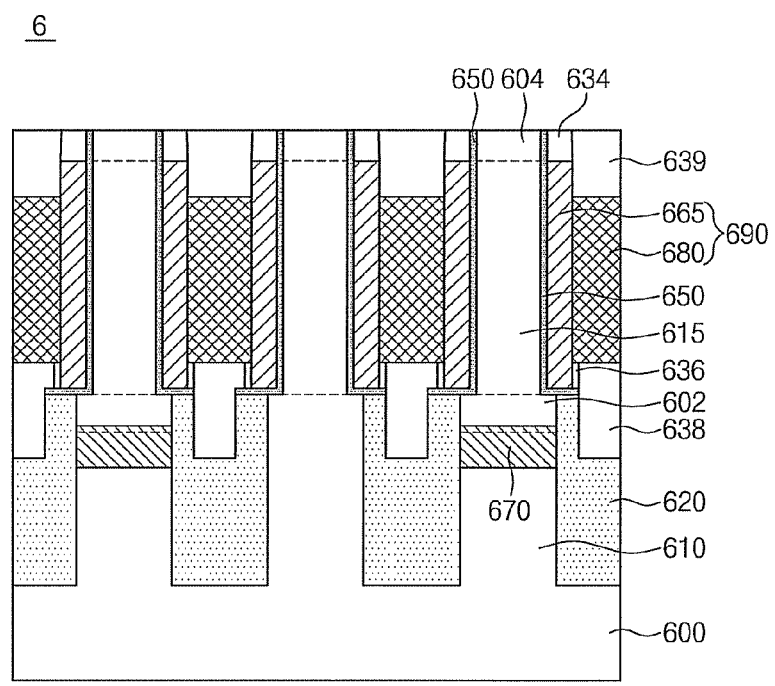

Referring to FIGS. 40A and 40B, a hard mask 630 may be removed by a planarization process and impurities may be implanted into an upper end of the vertical channels 615 to form an upper junction area 604. Thus, a vertical channel transistor 6 shown in FIG. 7 may be implemented which includes vertical channels 615 arranged in a zigzag pattern on the honeycomb-pattern active layer 610, line-shaped wordlines 690 where gate electrodes 665 formed in a self-aligned manner to surround the vertical channels 615 are interconnected by the wordline plug-in 680, and buried bitlines 670 extending in a zigzag pattern by providing impurities to the active layer 610.

Figure 42A:
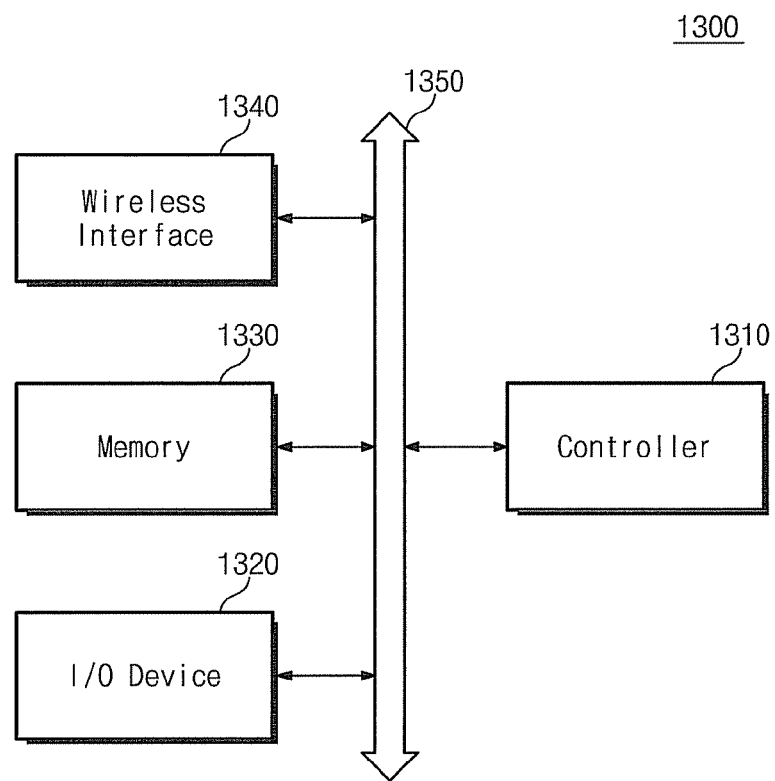
FIGS. 42A and 42B are block diagram illustrating an application example of a vertical channel transistor according to example embodiments of the inventive concepts.
Figure 42B:
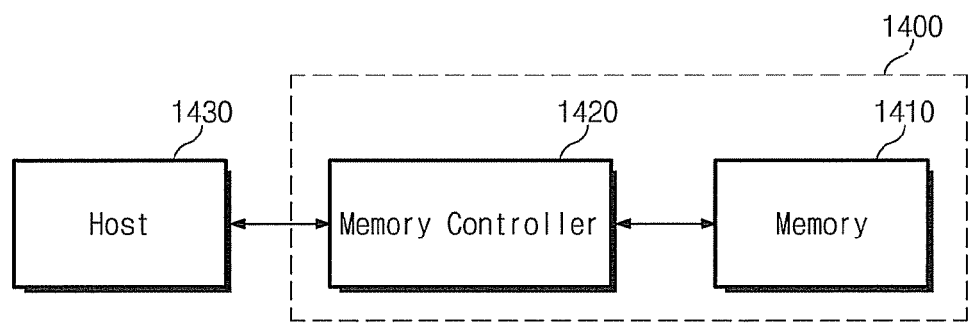

FIGS. 42A and 42B are block diagrams illustrating an application example of a vertical channel transistor according to example embodiments of the inventive concepts. While an example of a vertical channel transistor for use in a memory will now be described below, example embodiments are not limited thereto and the vertical channel transistor may be applied to non-memories.

FIG. 42A describes an electronic device 1300 including the vertical channel transistor according to example embodiments of the inventive concepts. The electronic device 1300 may be used in a wireless communication device, e.g., a personal digital assistant (PDA), a laptop computer, a portable computer, a web tablet, a wireless phone, a cellular phone, a digital music player, or any device capable of transmitting and/or receiving information in a wireless environment. The electronic device 1300 may include a controller 1310, an input/output device (I/O device) 1320 e.g., a keypad, a keyboard, or a display device, a memory 1330, and a wireless interface 1340 connected via a bus 1350. The controller 1310 includes at least one microprocessor, a digital signal processor, a microcontroller, or another process unit similar thereto. The memory 1330 may be used to store commands executed by the controller 1310. The memory 1330 may be used to store user data. The memory 1330 includes the vertical channel transistor according to example embodiments of the inventive concepts. The electronic device 1300 may use the wireless interface 1340 to transmit data to a wireless communication network communicating RF signals or receive data from the network. For example, the wireless interface 1340 may include a wireless transceiver. The electronic device 1300 may be used in a communication interface protocol of a three-generation communication system, e.g., CDMA, GSM, NADC, E-TDMA, WCDMA, or CDMA2000.

FIG. 42B refers to a memory system including a semiconductor memory device according to example embodiments of the inventive concepts. A memory system 1400 may include a memory device 1410 storing a relatively large amount of data and a memory controller 1420. The memory controller 1420 controls the memory device 1410 to read stored data from the memory device or write data in reply to a reading/writing request of a host 1430. The memory controller 1420 may form an address mapping table used to map addresses provided from the host 1430, e.g., a mobile device or a computer system to physical addresses. The memory device 1410 may include the vertical channel transistor according to example embodiments of the inventive concepts.

Because vertical channels are formed to protrude in a perpendicular direction to a surface of a substrate, extended channel length can be secured to prevent or reduce a short channel effect. Because the vertical channels are arranged in a zigzag pattern, integration density can increase. Because a gate electrode is formed to surround the vertical channels along an outer circumferential surface of the vertical channels, current driving capability can be improved. Because the gate electrode can be formed to have a precisely desired width, reproducibility of channel length can be secured and a bride between gate electrodes (wordlines) can be prevented or reduced. Because a gate electrode can be formed in a self-aligned manner, a photolithography process can be omitted.

While the inventive concepts has been described with reference to example embodiments, it will be apparent to those skilled in the art that various changes and modifications may be made without departing from the spirit and scope of the inventive concepts. Therefore, it should be understood that the above example embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A method for fabricating a vertical channel transistor, comprising:
    forming an active layer on a substrate;
    forming a plurality of vertical channels on the active layer;
    forming a plurality of isolated gate electrodes to surround sidewalls of the plurality of vertical channels;
    forming a buried bitline to extend along the active layer between the plurality of vertical channels;
    forming a plug-in between the plurality of vertical channels to connect the plurality of isolated gate electrodes; and
    forming a wordline on a location where the plug-in and the plurality of isolated gate electrodes are connected.

2. The method as set forth in claim 1, wherein the forming the active layer comprises forming the active layer in a line-shape and extending on the substrate in one direction.

3. The method as set forth in claim 2, wherein the forming the plurality of vertical channels comprises patterning the active layer such that the plurality of vertical channels are linearly arranged in the one direction, and
    wherein the vertical channels are linearly arranged along at least one of the center and edge of the active layer or are arranged in a zigzag pattern along both edges of the active layer.

4. The method as set forth in claim 1, wherein the forming the active layer comprises patterning the substrate to form the active layer to extend on the substrate where two oblique lines cross to have a honeycomb shape.

5. The method as set forth in claim 4, wherein the forming the plurality of vertical channels comprises patterning the active layer such that the plurality of vertical channels are arranged in a zigzag pattern on the substrate in one direction, and
    wherein the plurality of vertical channels are formed on an intersection of the two oblique lines.

6. The method as set forth in claim 1, wherein the forming the plurality of isolated gate electrodes comprises:
    forming a conductive material between the plurality of vertical channels to expose an upper portion of the plurality of vertical channels;
    forming a gate spacer on the upper portion of the plurality of vertical channels; and
    patterning the conductive material through an etch using the gate spacer as a mask such that the plurality of isolated gate electrodes are formed in a self-aligned manner to surround the sidewalls of the plurality of vertical channels.

7. The method as set forth in claim 1, wherein the forming the buried bitline comprises:
    recessing the active layer between the plurality of vertical channels to form a buried bitline pattern; and
    performing at least one of implanting impurities into the active layer exposed by the buried bitline pattern and filling the buried bitline pattern with a conductive material.

8. The method as set forth in claim 1, wherein the forming the wordline comprises:
    forming a wordline contact pattern to extend in a direction intersecting an extending direction of the buried bitline and between two adjacent vertical channels of the plurality of vertical channels to expose the plurality of isolated gate electrodes formed on the sidewalls of the two adjacent vertical channels of the plurality of vertical channels; and
    filling the wordline contact pattern with a conductive material to form the plug-in connecting the plurality of isolated gate electrodes.

9. The method as set forth in claim 1, further comprising:
    forming a gate dielectric layer to surround the sidewalls of the plurality of vertical channels; and
    forming upper and lower junction areas at upper and lower portions of the plurality of vertical channels.

10. A method for fabricating a vertical channel transistor, comprising:
    patterning a substrate to form an active layer;
    patterning the active layer to form a plurality of vertical channels protruding perpendicularly from the substrate;
    forming a conductive material between the plurality of vertical channels to expose an upper portion of the plurality of vertical channels;
    forming a gate spacer on the upper portion of the plurality of vertical channels;
    forming a plurality of gate electrodes in a self-aligned manner by patterning the conductive material using the gate spacer, the plurality of gate electrodes surrounding sidewalls of the plurality of vertical channels;
    forming a buried bitline in the active layer below the plurality of vertical channels, the buried bitline extending in a first horizontal direction on the substrate; and
    forming a plurality of plug-ins to connect the plurality of gate electrodes, the plurality of plug-ins extending between the plurality of vertical channels in a second horizontal direction perpendicular to the first horizontal direction.

11. The method as set forth in claim 10, wherein the forming the conductive material comprises:
    depositing a gate conductive layer between the plurality of vertical channels; and
    etching the gate conductive layer to form a recessed gate conductive layer exposing the upper portion of the plurality of vertical channels.

12. The method as set forth in claim 11, wherein the forming the gate spacer comprises:
    depositing an insulator on the recessed gate conductive layer; and
    patterning the insulator surrounding an outer circumferential surface of the plurality of vertical channels.

13. The method as set forth in claim 12, wherein the forming the plurality of gate electrodes comprises:
   removing a portion of the recessed gate conductive layer through a dry etch using the gate spacer to form a gate isolation pattern, and
   wherein the plurality of gate electrodes are isolated by the gate isolation pattern at the respective vertical channels of the plurality of vertical channels.

14. The method as set forth in claim 13, further comprising:
   implanting impurities into the active layer below the gate isolation pattern to form a lower junction area.

15. The method as set forth in claim 13, wherein the forming the buried bitline comprises:
   recessing the active layer below the gate isolation pattern to form a buried bitline pattern overlapped or offset with the plurality of vertical channels; and
   performing at least one of implanting impurities into the active layer exposed by the buried bitline pattern and filling the buried bitline pattern with the conductive material.

16. The method as set forth in claim 15, wherein the forming the plurality of plug-ins comprises:
   forming an insulating layer in the gate isolation pattern to cover the buried bitline;
   recessing the insulating layer to form a plurality of wordline contact patterns extending in the second horizontal direction between the plurality of vertical channels to expose the plurality of gate electrodes; and
   burying the wordline contact patterns through deposition of the conductive material.

17. A method for fabricating a vertical channel transistor, comprising:
   forming an active layer on a substrate;
   forming a plurality of vertical channels on the active layer;
   forming a plurality of isolated gate electrodes to surround sidewalls of the plurality of vertical channels;
   forming a buried bitline on the active layer to be overlapped with one of the plurality of vertical channels;
   forming a plug-in between the plurality of vertical channels to connect the plurality of isolated gate electrodes; and
   forming a wordline on a location where the plug-in and the plurality of isolated gate electrodes are connected.

* * * * *